United States Patent
Nishimura et al.

(10) Patent No.: US 12,269,107 B2
(45) Date of Patent: Apr. 8, 2025

(54) METHOD FOR MANUFACTURING COMPOSITE SUBSTRATE, AND COMPOSITE SUBSTRATE

(71) Applicant: Mitsubishi Electric Corporation, Tokyo (JP)

(72) Inventors: Kunihiko Nishimura, Tokyo (JP); Keisuke Nakamura, Tokyo (JP); Masahiro Fujikawa, Tokyo (JP); Shuichi Hiza, Tokyo (JP); Tomohiro Shinagawa, Tokyo (JP); Eiji Yagyu, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 713 days.

(21) Appl. No.: 17/608,570

(22) PCT Filed: Jun. 21, 2019

(86) PCT No.: PCT/JP2019/024725
§ 371 (c)(1),
(2) Date: Nov. 3, 2021

(87) PCT Pub. No.: WO2020/255376
PCT Pub. Date: Dec. 24, 2020

(65) Prior Publication Data
US 2022/0314357 A1     Oct. 6, 2022

(51) Int. Cl.
*B23K 101/36*   (2006.01)
*B23K 10/02*    (2006.01)
(Continued)

(52) U.S. Cl.
CPC .......... *B23K 10/02* (2013.01); *B23K 15/0006* (2013.01); *B23K 15/0046* (2013.01); *B23K 2101/36* (2018.08); *B23K 2103/16* (2018.08)

(58) Field of Classification Search
CPC .......... B23K 15/0046; B23K 15/0006; B23K 10/02; B23K 2101/36; B23K 2103/16;
(Continued)

(56) References Cited

U.S. PATENT DOCUMENTS

2002/0144774 A1* 10/2002 McReynolds ........... B81C 3/001
                                                                         156/286
2006/0255341 A1* 11/2006 Pinnington ............ B82Y 20/00
                                                                        257/E33.068
(Continued)

FOREIGN PATENT DOCUMENTS

JP          2-202023 A        8/1990
JP          6-61340 A         3/1994
(Continued)

OTHER PUBLICATIONS

International Search Report and Written Opinion mailed on Aug. 6, 2019, received for PCT Application PCT/JP2019/024725, Filed on Jun. 21, 2019, 10 pages including English Translation.
(Continued)

*Primary Examiner* — Eric S Stapleton
(74) *Attorney, Agent, or Firm* — XSENSUS LLP

(57) ABSTRACT

Removal of substrates in a composite substrate is facilitated, and flaking of the composite substrate in an unintended process is prevented. A method for manufacturing a composite substrate includes: forming a first bonding material in a first surface of a first substrate; forming, in the first surface, at least one groove located more inward than a periphery in a plan view of the first substrate; forming the first bonding material along an inner wall of the at least one groove, the first bonding material not filling into space enclosed by the inner wall of the at least one groove; forming a second bonding material on a second surface of a second substrate; and bonding the first bonding material and the second
(Continued)

bonding material together in a region except the at least one groove.

12 Claims, 21 Drawing Sheets

(51) Int. Cl.
  *B23K 15/00* (2006.01)
  *B23K 103/16* (2006.01)
(58) Field of Classification Search
  CPC ............. H01L 21/2007; H01L 33/0093; H01L 21/02002; H01L 21/764; H01L 21/7806; H01L 21/3065; H01L 21/31111; H01L 21/3083; H01L 29/2003; H01L 29/7786
  USPC .................................................... 219/121.46
  See application file for complete search history.

(56) References Cited

U.S. PATENT DOCUMENTS

| | | | | |
|---|---|---|---|---|
| 2007/0262381 | A1* | 11/2007 | Kojima | B81B 7/007 438/50 |
| 2015/0187652 | A1* | 7/2015 | Yamamoto | H01L 21/30604 438/458 |
| 2015/0200254 | A1* | 7/2015 | Diduck | H01L 29/1602 428/141 |
| 2015/0340278 | A1* | 11/2015 | Fournel | H01L 21/76251 438/456 |
| 2018/0033680 | A1* | 2/2018 | Yatou | B32B 38/0008 |
| 2022/0314357 | A1* | 10/2022 | Nishimura | B23K 15/0046 |

FOREIGN PATENT DOCUMENTS

| | | | |
|---|---|---|---|
| JP | 2003-257805 | A | 9/2003 |
| JP | 2007-305804 | A | 11/2007 |
| JP | 2014-175335 | A | 9/2014 |
| JP | 2015-522213 | A | 8/2015 |
| JP | 2016-509372 | A | 3/2016 |
| JP | 2016-171307 | A | 9/2016 |
| KR | 10-2003-0036127 | A | 5/2003 |
| WO | 2014/006562 | A1 | 1/2014 |
| WO | 2014/020906 | A1 | 2/2014 |

OTHER PUBLICATIONS

Notice of Reasons for Refusal mailed on Jan. 7, 2020, received for JP Application 2019-561205, 13 pages including English Translation.
Notice of Reasons for Refusal mailed on Mar. 31, 2020, received for JP Application 2019-561205,8 pages including English Translation.
Korean Office Action issued Nov. 18, 2022, in corresponding Korean Patent Application No. 10-2021-7040425 (with machine-generated English translation), 12 pages.
Extended European search report issued on Jun. 1, 2022, in corresponding European patent Application No. 19933414.5, 9 pages.
Chinese Office Action issued Jan. 10, 2025, in corresponding Chinese Patent Application No. 201980097561.9, 15pp.

* cited by examiner

METHOD FOR MANUFACTURING COMPOSITE SUBSTRATE, AND COMPOSITE SUBSTRATE

CROSS-REFERENCE TO RELATED APPLICATION

The present application is based on PCT filing PCT/JP2019/024725, filed Jun. 21, 2019, the entire contents of which are incorporated herein by reference.

TECHNICAL FIELD

The technology disclosed in this DESCRIPTION relates to a method for manufacturing a composite substrate, and the composite substrate.

BACKGROUND ART

High electron mobility transistors (i.e., HEMT) each including a gallium nitride (GaN) film as an active layer have been put to practical use as high-power and high-frequency transistors (see, for example, Patent Document 1).

When a GaN transistor made of diamond as a base material is used, a supporting diamond substrate is bonded to a thin or curved polycrystalline diamond substrate with an inorganic adhesive for applying transistor fabrication processes including deposition, photolithography, and etching. Then, a flat composite substrate with an appropriate thickness is formed from the polycrystalline diamond substrate and the supporting diamond substrate.

PRIOR ART DOCUMENTS

Patent Documents

[Patent Document 1] Japanese Unexamined Patent Application Publication No. 2015-522213.

SUMMARY

Problem to be Solved by the Invention

When the composite substrate is used, the composite substrate is immersed into a chemical solution that can dissolve the inorganic adhesive for removing the supporting diamond substrate from the polycrystalline diamond substrate.

However, it takes relatively a long time to dissolve the adhesive. When the transistor fabrication processes include a process of using a chemical solution similar to the aforementioned chemical solution, the similar chemical solution may infiltrate the inorganic adhesive, and the supporting diamond substrate may inadvertently flake off from a GAN-on-diamond substrate. Thus, the transistor fabrication processes cannot be stably performed.

The technology disclosed in the DESCRIPTION has been conceived in view of the problems. The object is to provide the technology facilitating removal of each of the substrates in the composite substrate and preventing flaking of the composite substrate in an unintended process.

Means to Solve the Problem

A first aspect of the technology disclosed in the DESCRIPTION includes: forming a first bonding material in a first surface of a first substrate; forming, in the first surface, at least one groove located more inward than a periphery in a plan view of the first substrate; forming the first bonding material along an inner wall of the at least one groove, the first bonding material not filling into space enclosed by the inner wall of the at least one groove; forming a second bonding material on a second surface of a second substrate; and bonding the first bonding material and the second bonding material together in a region except the at least one groove with the space enclosed by the inner wall of the at least one groove being maintained in a vacuum; and immersing, in a dissolving solution for dissolving the first bonding material and the second bonding material, the composite substrate with the first bonding material and the second bonding material being bonded together.

A second aspect of the technology disclosed in the DESCRIPTION is a composite substrate for manufacturing a GaN transistor made of diamond as a base material, the composite substrate includes: a first substrate with a first surface; a second substrate with a second surface; a first bonding material formed in the first surface, the first bonding material being dissolvable; and a second bonding material formed on the second surface, the second bonding material being dissolvable and bonded to the first bonding material, wherein at least one groove is formed in the first surface, the at least one groove being located more inward than a periphery in a plan view of the first substrate, the first bonding material is formed along an inner wall of the at least one groove, first bonding material not filling into space enclosed by the inner wall of the at least one groove, and the first bonding material and the second bonding material are bonded together in a region except the at least one groove, the space enclosed by the inner wall of the at least one groove is in a vacuum, and dissolution of the first bonding material and the second bonding material separates the first substrate from the second substrate.

Effects of the Invention

According to the first aspect of the technology disclosed in the DESCRIPTION, infiltration of a dissolving solution into the space enclosed by the inner wall of the groove accelerates dissolution of the first and second bonding materials. Thus, the time required to remove the first substrate can be shortened. Formation of the groove more inward than the periphery can prevent dissolution of the first and second bonding materials in an unintended process and flaking of the composite substrate.

According to the second aspect of the technology disclosed in the DESCRIPTION, infiltration of a dissolving solution into the space enclosed by the inner wall of the groove accelerates dissolution of the first and second bonding materials. Thus, the time required to remove the first substrate can be shortened. Formation of the groove more inward than the periphery can prevent dissolution of the first and second bonding materials in an unintended process and flaking of the composite substrate.

The object, features, aspects and advantages related to the technology disclosed in the DESCRIPTION will become more apparent from the following detailed description and the accompanying drawings.

DESCRIPTION OF EMBODIMENTS

Figure 1:
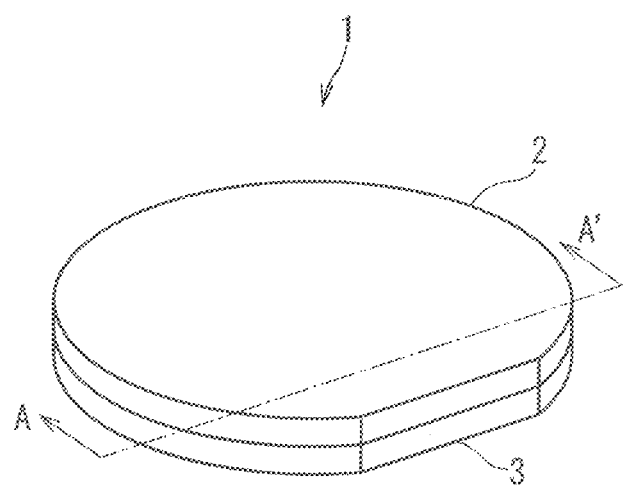
FIG. 1 is a perspective view illustrating an example structure of a composite substrate according to an embodiment.

Hereinafter, Embodiments will be described with reference to the accompanying drawings. Although detailed features are described for description of the technology in Embodiments below, they are mere exemplification and not necessarily essential features for making Embodiments feasible.

Note that the drawings are drawn in schematic form, and structures are appropriately omitted or simplified for convenience of the description. The mutual relationships in size and position between the structures in the different drawings are not necessarily accurate but may be appropriately changed. The drawings such as not cross-sectional views but plan views are sometimes hatched for facilitating the understanding of the details of Embodiments.

In the following description, the same reference numerals are assigned to the same constituent elements, and their names and functions are the same. Therefore, detailed description of such constituent elements may be omitted to avoid redundant description.

Unless otherwise specified, an expression "comprising", "including", or "having" a certain constituent element is not an exclusive expression for excluding the presence of the other constituent elements in the following description.

The ordinal numbers such as "first" and "second" in the following description are used for convenience to facilitate the understanding of the details of Embodiments. The order indicated by these ordinal numbers does not restrict the details of Embodiments.

Unless otherwise specified, the expressions indicating relative or absolute positional relationships, for example, "in one direction", "along one direction", "parallel", "orthogonal", "central", "concentric", and "coaxial" in the following description include those exactly indicating the positional relationships and those where an angle or a distance is relatively changed within tolerance or to the extent that similar functions can be obtained.

Unless otherwise specified, the expressions indicating equality, for example, "same", "equal", "uniform", and "homogeneous" in the following description include those indicating exact equal states and those in the presence of a difference within tolerance or to the extent that similar functions can be obtained.

In the following description, even when terms expressing a particular position and a particular direction such as "up", "down", "left", "right", "side", "bottom", "front", and "back" are used, these terms are used for convenience to facilitate the understanding of the details of Embodiments, and do not relate to the directions that are actually used.

In the following description, the expression of, for example, "an upper surface of" or "a lower surface of" a target element includes states where not only the upper surface of the target element itself is formed but also another element is formed on the upper surface thereof. Specifically, for example, the expression "Y formed on the upper surface of X" does not inhibit interposition of another element "Z" between X and Y.

Unless otherwise specified, the expressions indicating shapes, for example, "rectangular" or "cylindrical" include those indicating geometrically exact shapes and those indicating roughness or a chamfer within tolerance or to the extent that similar functions can be obtained in the following description.

Embodiment 1

Hereinafter, a method for manufacturing a composite substrate according to Embodiment 1, and the composite substrate will be described.

The HEMTs that have been put to practical use as high-power and high-frequency transistors can achieve a high withstand voltage through use of GaN in an active layer, and achieve low resistance through use of the HEMT structure. Thus, the HEMTs can receive high power.

However, Joule heating generated in transistor parts upon receipt of the high power may destroy elements.

Normally, high-power transistors include heat dissipating components called heat sinks. Since a heated portion is limited to a micro area in a transistor, the problem is how to transfer heat from the micro heated portion to the heat sink.

The GaN film in which a transistor is formed is bonded to a heat sink through a substrate made of, for example, silicon carbide (SiC) as a base material. Recent years have seen proposals of a structure using diamond higher in thermal conductivity as a base material, instead of SiC.

When diamond is used as a base material, the heat generated in a micro area of the GaN film diffuses through a diamond layer in a lateral direction. Since the heat is transferred to a wide area of the heat sink bonded to the GaN film through a diamond substrate, an end-point temperature in a heated portion can be consequently reduced.

In a structure using diamond as a base material for forming the GaN film, a GaN thin film is crystal grown on the upper surface of a Si substrate or a SiC substrate, and further a supporting substrate is bonded to the upper surface of the GaN thin film. Then, the Si substrate or the SiC substrate is removed.

After a protective film such as a silicon nitride (SiN) film is formed on the lower surface of the GaN thin film exposed as a result of the removal, a polycrystalline diamond layer is formed in chemical vapor deposition (CVD) on the protective film.

Then, removal of the supporting substrate can produce a structure in which the GaN thin film is formed on the upper surface of the polycrystalline diamond substrate.

Further, application of the transistor fabrication processes to the GaN thin film can produce a GaN transistor made of diamond as a base material.

A substrate in which the GaN thin film is formed on the upper surface of the polycrystalline diamond substrate will be hereinafter referred to as a GAN-on-diamond substrate.

When a GaN transistor made of diamond as a base material is used, a supporting diamond substrate is bonded to a thin or curved polycrystalline diamond substrate with an inorganic adhesive for applying the transistor fabrication processes including deposition, photolithography, and etching. Then, a flat composite substrate with an appropriate thickness is formed from the polycrystalline diamond substrate and the supporting diamond substrate.

Suppose that if the polycrystalline diamond layer can be formed thick by CVD, the supporting diamond substrate need not be separately bonded as described above, and the transistor fabrication processes can be applied as they are.

However, the deposition rate when the polycrystalline diamond layer is formed by CVD is so low that the difficulty lies in forming the polycrystalline diamond layer thick by CVD.

Even if the polycrystalline diamond layer can be formed thick by CVD, the curvature of the substrate in the deposition process is sharp, and the transistor fabrication processes cannot obviously be applied.

In view of these, the polycrystalline diamond layer should have the minimum thickness such that the layer functions as a heat transfer material, for example, approximately 100 µm. This requires bonding a supporting diamond substrate in forming a composite substrate.

The composite substrate fabricated in such a manner requires selection of materials with close coefficients of thermal expansion for the GAN-on-diamond substrate and the supporting diamond substrate that are included in the composite substrate to prevent the curvature in a thermal process of the transistor fabrication processes.

In view of this, the diamond substrate separately fabricated as a supporting substrate is used. Furthermore, a method allowing heat resistance in a structure after the bonding needs to be selected as a method for bonding the supporting substrate, for example, bonding with an inorganic adhesive.

Moreover, the supporting diamond substrate needs to be removed from the composite substrate whose transistor fabrication processes have been completed. Here, since the GAN-on-diamond substrate is as thin as approximately 100 µm, the supporting diamond substrate cannot be removed in a mechanical manner for preventing damage in the substrate.

Here, the supporting diamond substrate is removed from the GAN-on-diamond substrate by immersing the composite substrate in a chemical solution and allowing the chemical solution to infiltrate a porous inorganic adhesive.

The composite substrate is immersed into a chemical solution that can dissolve the inorganic adhesive for removing the supporting diamond substrate from the GAN-on-diamond substrate.

However, it takes relatively a long time to dissolve the adhesive. When the transistor fabrication processes include a process of using a chemical solution similar to the aforementioned chemical solution, the similar chemical solution may infiltrate the inorganic adhesive, and the supporting diamond substrate may inadvertently flake off from the GAN-on-diamond substrate. Thus, the transistor fabrication processes cannot be stably performed.

[Structure of Composite Substrate]

The composite substrate according to Embodiment 1 will be hereinafter described with reference to the drawings.

FIG. 1 is a perspective view illustrating an example structure of the composite substrate according to Embodiment 1. As illustrated in the example of FIG. 1, a composite substrate 1 includes a GAN-on-diamond substrate 2, and a supporting diamond substrate 3.

Figure 2:
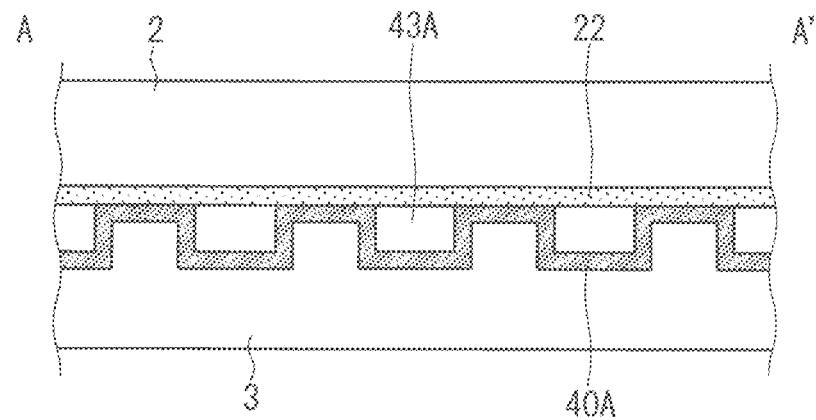
FIG. 2 is a cross-sectional view illustrating a cross section taken along the line A-A' in FIG. 1.

FIG. 2 is a cross-sectional view illustrating a cross section taken along the line A-A' in FIG. 1. As illustrated in the example of FIG. 2, a SiO$_2$ bonding layer 22 and a SiO$_2$ bonding layer 40A are formed on a bonded surface between the GAN-on-diamond substrate 2 and the supporting diamond substrate 3. Furthermore, space 43A is formed between these bonding layers.

The cross-sectional shapes of the SiO$_2$ bonding layer 40A and the space 43A are not limited to those in the example illustrated in FIG. 2. For example, the grooves in the upper surface of the supporting diamond substrate 3 may be curved in the side surface, and the SiO$_2$ bonding layer formed in the side surface may also be curved, which will be described later.

Figure 3:
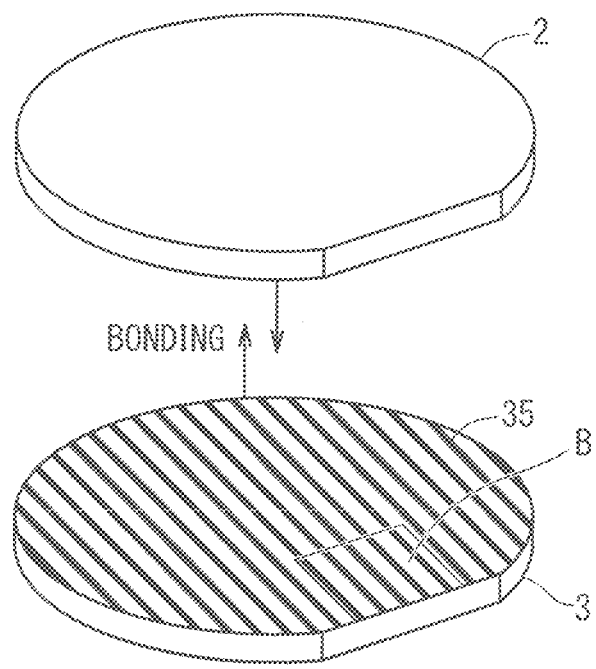
FIG. 3 illustrates an example of a semiconductor substrate and a supporting substrate that are included in the composite substrate according to the embodiment.

FIG. 3 illustrates an example of a semiconductor substrate and a supporting substrate that are included in the composite substrate according to Embodiment 1. As illustrated in the example of FIG. 3, machined grooves 35 are formed in the bonded surface of the supporting diamond substrate 3 with the GAN-on-diamond substrate 2.

Figure 4:
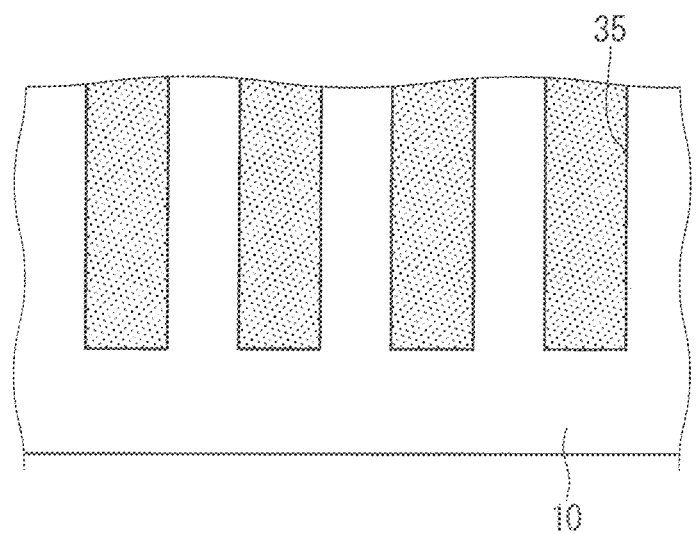
FIG. 4 is an enlarged plan view of a B region in FIG. 3.

FIG. 4 is an enlarged plan view of a B region in FIG. 3. As illustrated in the example of FIG. 4, the machined grooves 35 are interrupted without reaching a periphery 10 of the supporting diamond substrate 3. The space in the machined grooves 35 is closed in the bonded surface between the supporting diamond substrate 3 and the GAN-on-diamond substrate 2.

[Method for Manufacturing Composite Substrate]

Next, a method for manufacturing the composite substrate according to Embodiment 1 will be described.

The processes of manufacturing the composite substrate according to Embodiment 1 are roughly divided into the next four processes, i.e., a process of preparing a GAN-on-diamond substrate, a process of preparing a supporting diamond substrate, a process of fabricating a composite substrate, and a process of forming a GAN-on-diamond transistor.

Figure 5:
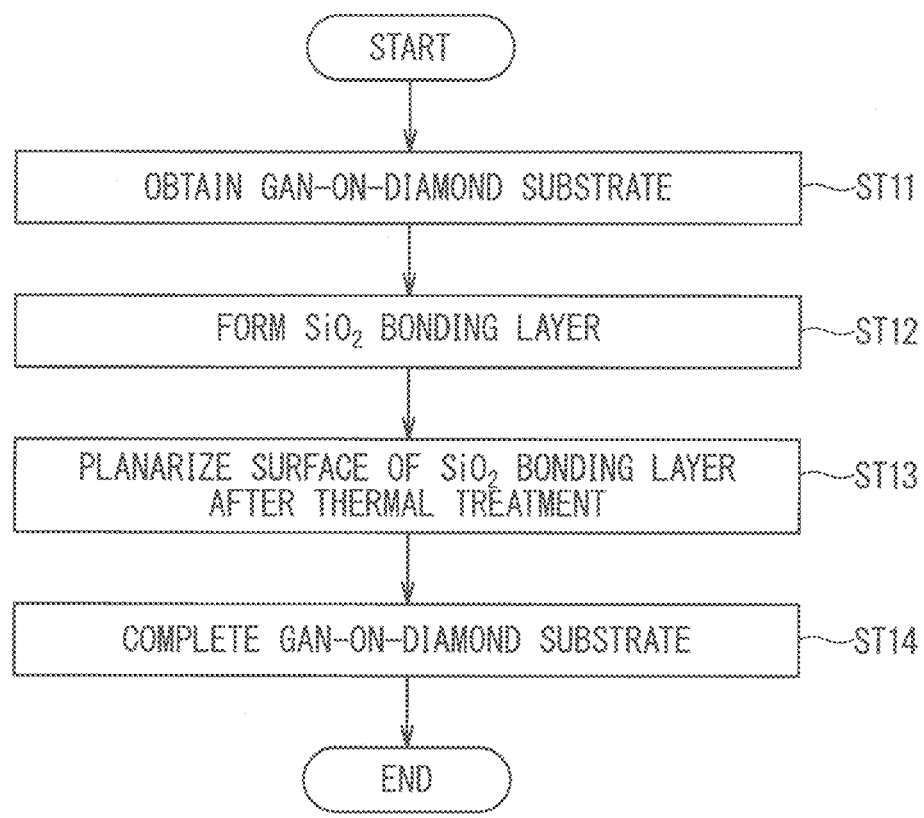
FIG. 5 is a flowchart illustrating a process of preparing a GAN-on-diamond substrate according to the embodiment.

FIG. 5 is a flowchart illustrating the process of preparing a GAN-on-diamond substrate among the processes.

Figure 6:
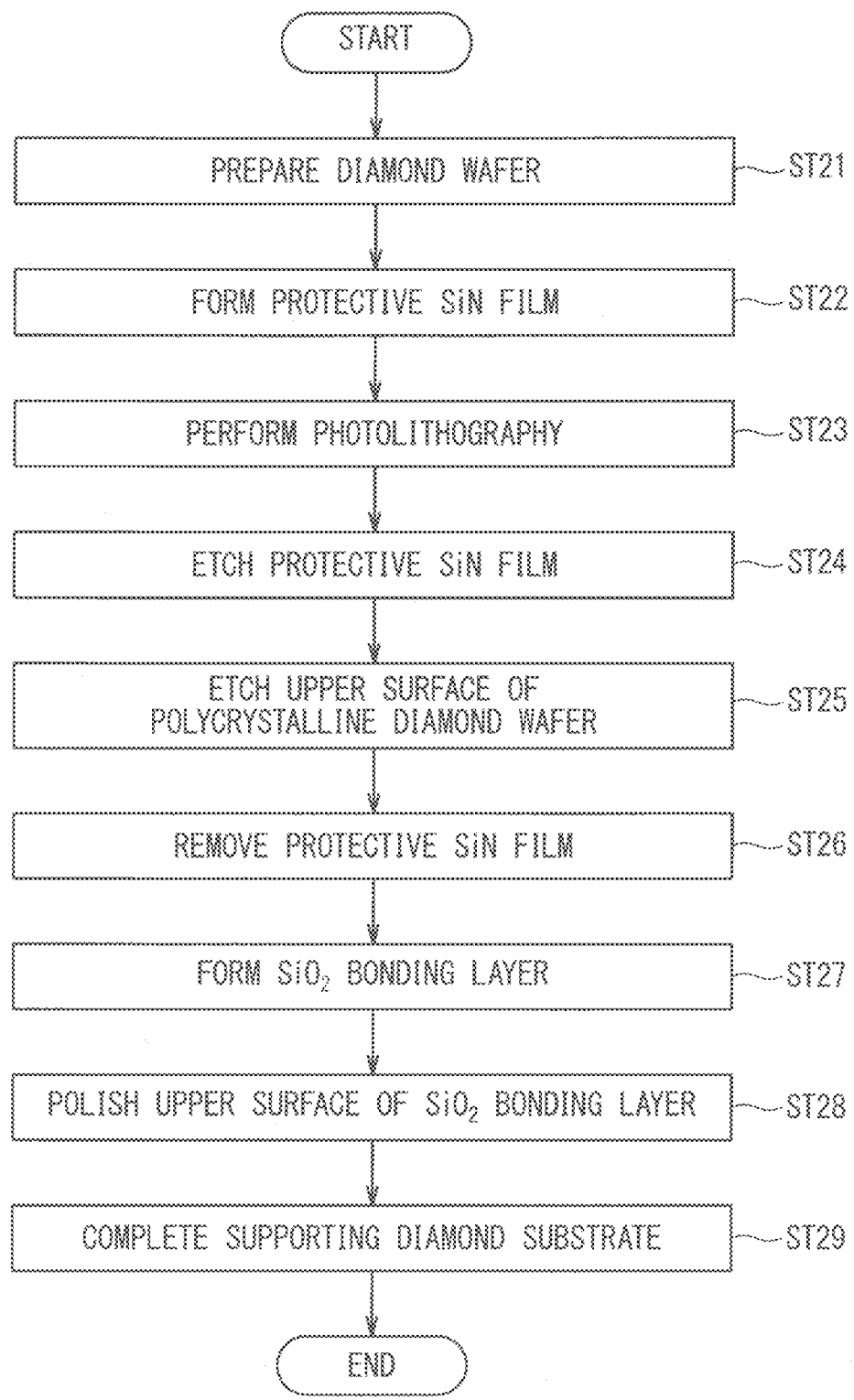
FIG. 6 is a flowchart illustrating a process of preparing a supporting diamond substrate according to the embodiment.

FIG. 6 is a flowchart illustrating the process of preparing a supporting diamond substrate among the processes.

Figure 7:
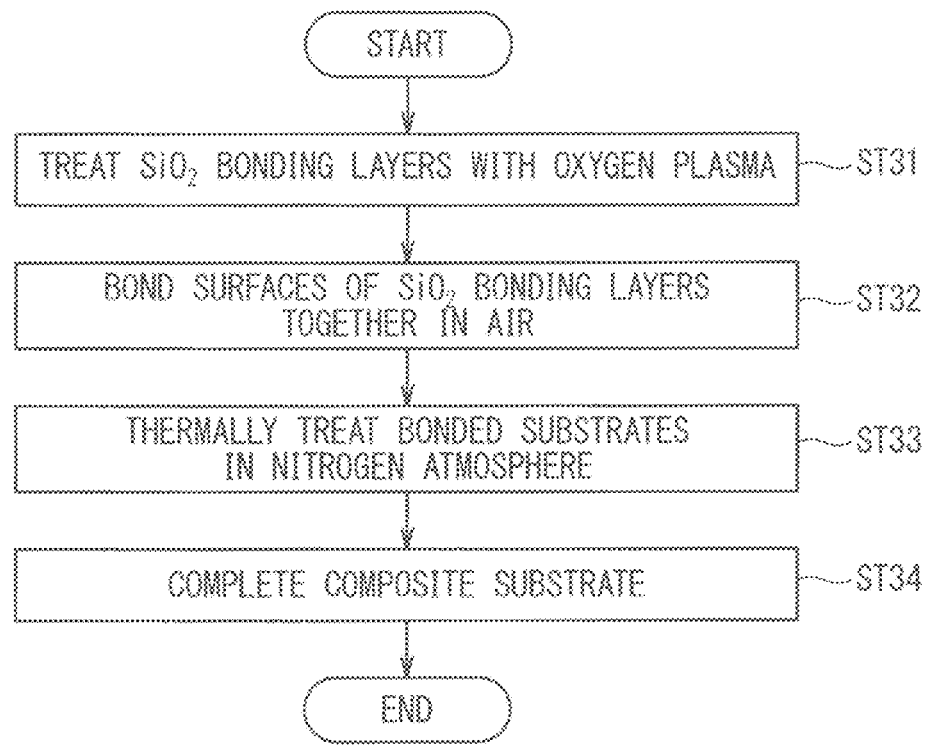
FIG. 7 is a flowchart illustrating a process of fabricating a composite substrate according to the embodiment.

FIG. 7 is a flowchart illustrating the process of fabricating a composite substrate among the processes.

Figure 8:
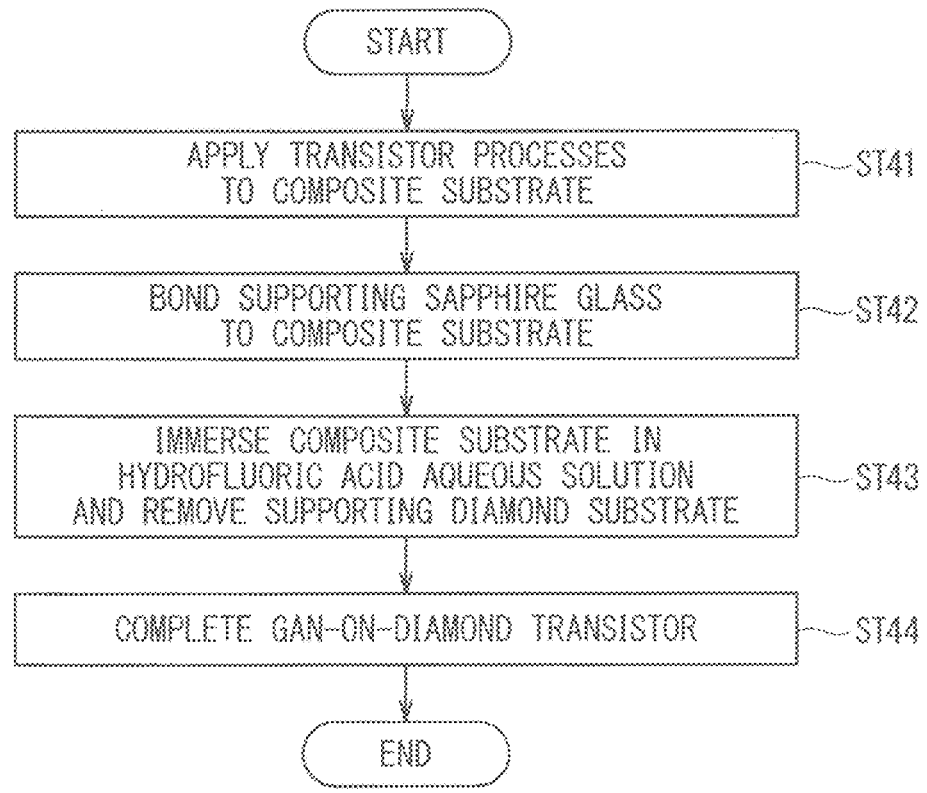
FIG. 8 is a flowchart illustrating a process of forming a GAN-on-diamond transistor according to the embodiment.

FIG. 8 is a flowchart illustrating the process of forming a GAN-on-diamond transistor among the processes.

The composite substrate according to Embodiment 1 is completed through the process of fabricating a composite substrate in FIG. 7. Furthermore, the process of forming a GAN-on-diamond transistor in FIG. 8 is described as merely a latter process using the composite substrate according to Embodiment 1.

Since the composite substrate according to Embodiment 1 produces the advantages in performing the latter process, the latter process will be described in Embodiment 1 in detail.

[Process of Preparing GAN-On-Diamond Substrate]

First, the process of preparing a GAN-on-diamond substrate will be described with reference to FIGS. 5, and 9 to 13.

Here, FIGS. 9 to 13 are cross-sectional views illustrating example states during the process of preparing a GAN-on-diamond substrate.

Figure 9:
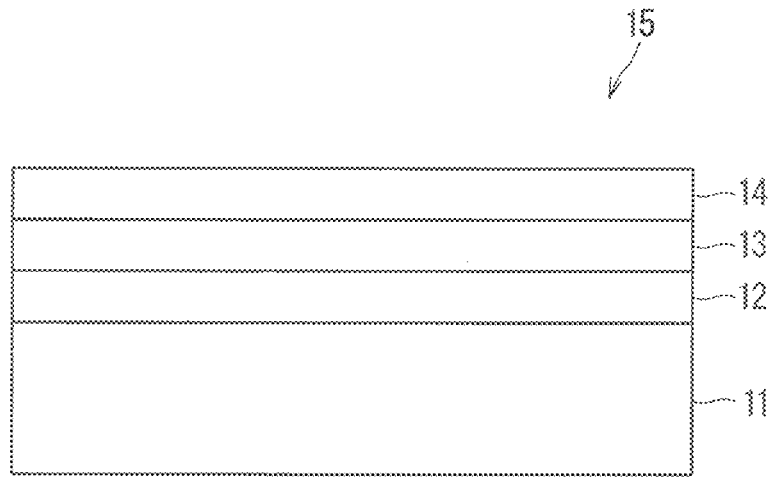
FIG. 9 is a cross-sectional view illustrating an example state during the process of preparing a GAN-on-diamond substrate according to the embodiment.

First, a GAN-on-Si substrate 15 as illustrated in the example of FIG. 9 is fabricated.

The detailed processes are described next. For example, a buffer layer 12 including e.g., an aluminum nitride (AlN) film or an aluminum gallium nitride (AlGaN) film, a GaN film 13, and an AlGaN film 14 are epitaxially grown sequentially in this order on an Si substrate 11 of 2 inches.

For example, a composition ratio or a film thickness of the buffer layer 12 is adjusted so that the lattice mismatch with the Si substrate 11 in contact with the lower surface of the buffer layer 12 and the lattice mismatch with the GaN film 13 in contact with the upper surface of the buffer layer 12 are relaxed and further the stress in the GaN film 13 is relaxed.

The buffer layer 12 may be a single layer, or may include a plurality of laminated layers with different composition ratios. The buffer layer 12 is, for example, 0.7 μm thick.

The sequential epitaxial growth of the AlGaN film 14 on the upper surface of the GaN film 13 creates a high-concentration electron layer referred to as two-dimensional electron gas, in the vicinity of an interface with the AlGaN film 14 in the GaN film 13 due to spontaneous polarization effects and piezoelectric polarization effects of AlGaN.

Unlike an electron layer formed by doping impurities, electrons in this electron layer are less subject to scattering of ions, and have very high electron mobility.

Although not illustrated in FIG. 9, a cap layer including a GaN film may be further formed on the upper surface of the AlGaN film 14, or a layer doped with impurities such as Fe or carbon (C) may be interposed in a part of the GaN film 13. As such, the GAN-on-Si substrate 15 is fabricated.

Figure 10:
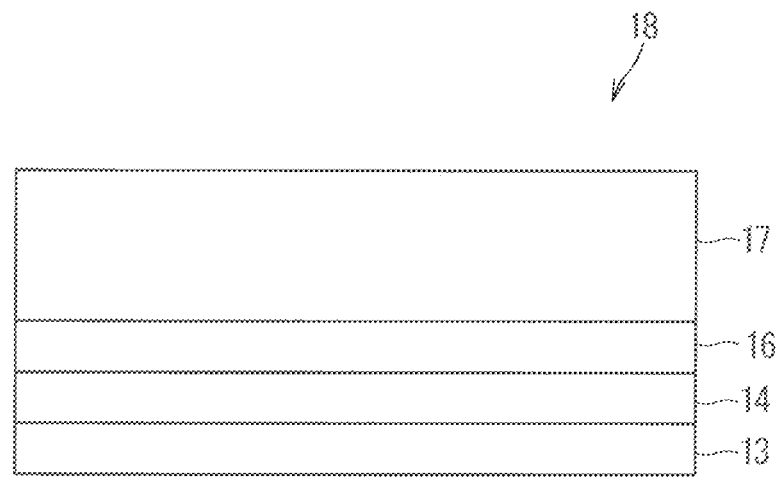
FIG. 10 is a cross-sectional view illustrating an example state during the process of preparing a GAN-on-diamond substrate according to the embodiment.

Next, a supporting substrate bonding layer 16 is formed on the upper surface of the AlGaN film 14 in the GAN-on-Si substrate 15 as illustrated in the example of FIG. 10. Then, a supporting substrate 17 is further bonded to the upper surface of the supporting substrate bonding layer 16.

Afterward, a GaN-transferred substrate 18 is obtained by removing the Si substrate 11 and the buffer layer 12.

Since the GaN-transferred substrate 18 is submitted to a high-temperature process later, the supporting substrate bonding layer 16 and the supporting substrate 17 need high-temperature resistance.

In Embodiment 1, laminated films of a SiN film and a SiO$_2$ film are applied as the supporting substrate bonding layer 16. Disposing the SiN film closer to the AlGaN film 14 in the laminated films is effective at preventing release of nitrogen (N) from the AlGaN film 14 or the GaN film 13 in the high-temperature process.

Furthermore, the SiO$_2$ film in the laminated films as the supporting substrate bonding layer 16 is effective at strongly bonding the supporting substrate 17. The SiO$_2$ film is formed with a thickness of, for example, 1.5 μm by CVD using tetraethoxysilane (TEOS). Then, annealing is performed on the SiO$_2$ film at 700° C., and further the surface of the SiO$_2$ film is planarized. Next, the SiO$_2$ film is bonded to a Si substrate that is the supporting substrate 17, through a direct bonding method.

The use of the direct bonding method can produce the adhesion strength enough to endure the high-temperature process, between the SiO$_2$ film and the Si substrate that is the supporting substrate 17. The bonding interface does not have outgassing emissions.

Besides, an inorganic adhesive containing, as a main component, alumina or silica can be used as the supporting substrate bonding layer 16.

Next, the GaN-transferred substrate 18 is fabricated by removing the Si substrate 11 and the buffer layer 12. The Si substrate 11 can be removed by, for example, mechanical polishing.

The buffer layer 12 made of, for example, AlGaN has a very slow mechanical polishing rate.

Thus, when the entirety of the Si substrate 11 is removed to expose the buffer layer 12, the mechanical polishing is temporarily stopped.

Then, the buffer layer 12 is removed by changing the polishing condition to a condition for AlGaN polishing and polishing the buffer layer 12 at a slow rate. Thus, the GaN film 13 is exposed.

Although the Si substrate 11 and the buffer layer 12 are removed by mechanical polishing in Embodiment 1, vapor phase etching using reactive ion etching (RIE) may be applicable. Since both of the mechanical polishing and the RIE remove only machined surfaces, they are suitable for removing the Si substrate 11, with the supporting substrate 17 that is the Si substrate being disposed on the opposite side according to Embodiment 1.

If the supporting substrate 17 is made of, for example, sapphire instead of Si, treatment using a chemical solution such as hydrofluoric-nitric acid may be applicable for removing the Si substrate 11. When the treatment using a chemical solution is applicable, a ratio (i.e., a selection ratio) of a removal rate in the Si substrate 11 to a removal rate in the buffer layer 12 is significantly increased. Thus, the removal can be reliably stopped when the buffer layer 12 is exposed.

Although the laminated films of the SiN film and the $SiO_2$ film are applied as the supporting substrate bonding layer 16 in Embodiment 1, the materials are not limited to these, but the supporting substrate bonding layer 16 may be of different film types, or may be made of an inorganic adhesive containing, as a main component, alumina or silica.

Figure 11:
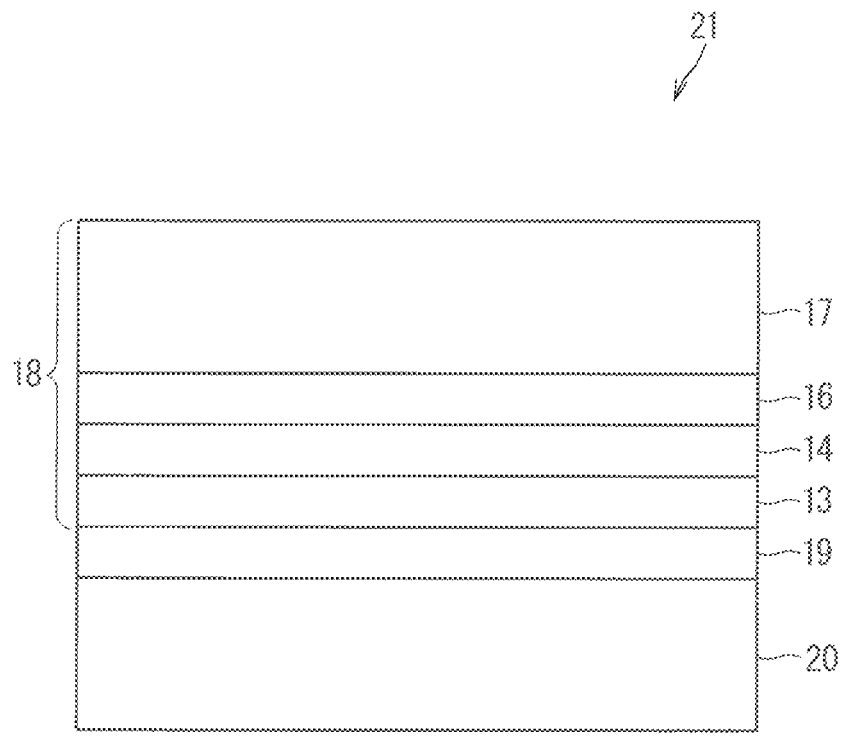
FIG. 11 is a cross-sectional view illustrating an example state during the process of preparing a GAN-on-diamond substrate according to the embodiment.

Next, a protective layer 19 is formed on the lower surface of the GaN film 13 in the GaN-transferred substrate 18 as illustrated in the example of FIG. 11. Then, a polycrystalline diamond film 20 is formed on the lower surface of the protective layer 19, thus fabricating a polycrystalline diamond coated substrate 21.

The object of forming the protective layer 19 is to protect the GaN film 13 with the protective layer 19 in forming the polycrystalline diamond film 20. In Embodiment 1, the protective layer 19 is an amorphous Si thin film, and formed by, for example, plasma CVD.

The protective layer 19 is thick as required to protect the GaN film 13. When the protective layer 19 is too thick, the protective layer 19 interferes with conduction of heat between the GaN film 13 and the polycrystalline diamond film 20.

In Embodiment 1, amorphous Si 20 nm thick is formed as the protective layer 19.

The protective layer 19 is not limited to the one made of amorphous Si, but may be of different film types. If damage on the GaN film 13 is negligible, the protective layer 19 need not be formed.

Microwave plasma CVD using methane gas and hydrogen is applied to form the polycrystalline diamond film 20. A highly crystalline polycrystalline diamond film can be formed at a substrate temperature of 850° C. by microwave plasma CVD.

When the substrate temperature is higher or lower than this temperature, the crystallinity of the polycrystalline diamond film decreases, and graphite components increase.

In Embodiment 1, cooling conditions and plasma power of a stage are adjusted so that the substrate temperature is set to 850° C., thus forming the polycrystalline diamond film 20 with a thickness of 100 μm.

Irregularities corresponding to crystal grains and having a height difference of 10 μm are formed on the surface of the polycrystalline diamond film 20. Thus, the surface is planarized by mechanical grinding until the height difference is reduced to 0.5 μm.

Although the polycrystalline diamond film 20 is formed by CVD in Embodiment 1, the method for forming the polycrystalline diamond film is not limited to this.

Examples of the method may include bonding a polycrystalline diamond substrate separately fabricated. When the polycrystalline diamond substrate is bonded, the surface of the GaN film 13 need not be protected. Thus, the protective layer 19 is unnecessary. This method is advantageous in view of conduction of heat.

When a bonding layer needs to be inserted instead of the protective layer 19 to increase the adhesion strength of the polycrystalline diamond substrate, attention should be given because the bonding layer interferes with conduction of heat.

Figure 12:
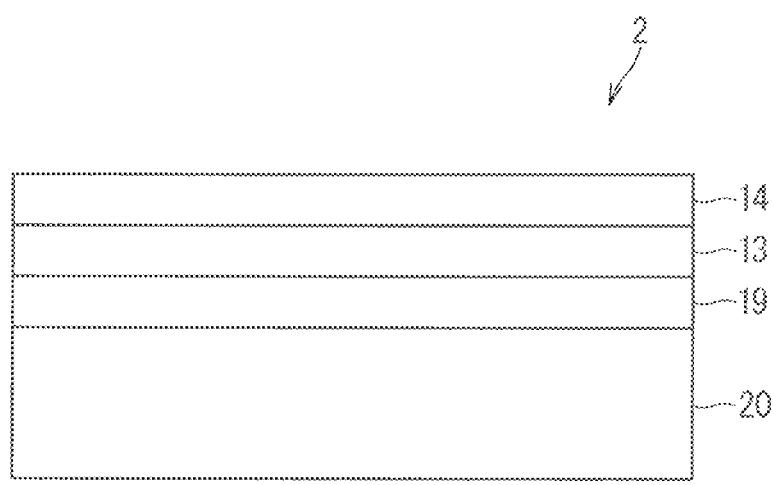
FIG. 12 is a cross-sectional view illustrating an example state during the process of preparing a GAN-on-diamond substrate according to the embodiment.

As illustrated in the example of FIG. 12, the GAN-on-diamond substrate 2 is obtained by removing the supporting substrate 17 and the supporting substrate bonding layer 16 (Step ST11 in FIG. 5).

In Embodiment 1, a method for immersing the supporting substrate 17 and the supporting substrate bonding layer 16 in a mixed solution of fluoric acid and nitric acid is used to dissolve and remove these.

In this case, the polycrystalline diamond film 20 is formed not only on the lower surface of the protective layer 19 that is a deposition surface, but also around the side surface and the upper surface of the GaN-transferred substrate 18 (i.e., the upper surface of the supporting substrate 17). Thus, the polycrystalline diamond film remains on the side surface and the upper surface of the GaN-transferred substrate 18 even after the dissolution and removal using fluoric acid and nitric acid.

For preventing this, a process of removing a redundant portion of the polycrystalline diamond film by trimming (i.e., cutting) an end portion of the substrate using, for example, a laser beam machine before the dissolution and removal can be added.

The method for removing the supporting substrate 17 and the supporting substrate bonding layer 16 is not limited to the dissolution and removal using a mixed solution of fluoric acid and nitric acid. Examples of the method may include removal by mechanical polishing and removal through dry etching such as the RIE.

Even when the end portion of the substrate is trimmed by a laser in the removal by mechanical polishing as described above, the polycrystalline diamond film may remain on the upper surface of the supporting substrate 17 and interfere with the polishing. Thus, attention should be given to such a case.

Both in the mechanical polishing and the dry etching, attention should be given to prevent the exposed AlGaN film 14 from being damaged at the completion of the removal.

A process of forming a SiN film approximately 100 nm thick on the upper surface of the AlGaN film 14 may be added to protect the AlGaN film 14, which is not illustrated in FIG. 12.

Figure 13:
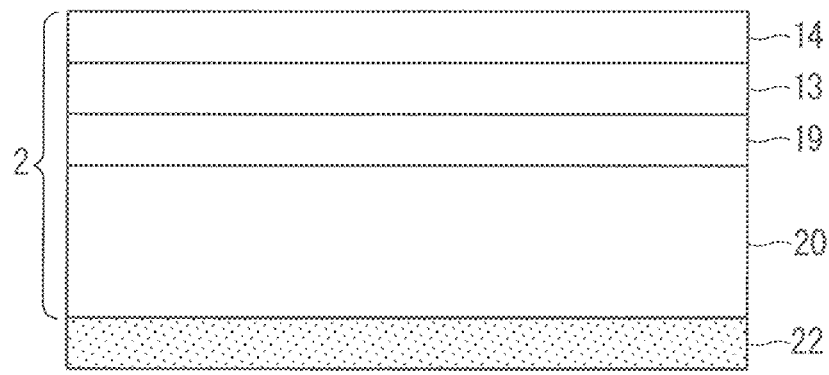
FIG. 13 is a cross-sectional view illustrating an example state during the process of preparing a GAN-on-diamond substrate according to the embodiment.

Next, the $SiO_2$ bonding layer 22 is formed on the lower surface of the polycrystalline diamond film 20 with a thickness of, for example, 2 μm by plasma CVD using TEOS as illustrated in the example of FIG. 13 (Step ST12 in FIG. 5).

Then, the surface of the $SiO_2$ bonding layer 22 is planarized after the thermal treatment in a nitrogen atmosphere at 700° C. (Step ST13 in FIG. 5).

The thermal treatment should be performed in an inert furnace to prevent oxidation of diamond.

Since the $SiO_2$ bonding layer 22 is formed on the lower surface of the polycrystalline diamond film 20 with surface irregularities with a height difference of approximately 0.5 µm, similar surface irregularities are formed on the surface of the $SiO_2$ bonding layer 22.

Thus, the planarization process after the thermal treatment can be combined with, for example, a planarization process through mechanical polishing using a surface plate and then a smoothing process using chemical mechanical polishing (CMP).

As such, the GAN-on-diamond substrate 2 with the $SiO_2$ bonding layer 22 formed is completed (Step ST14 in FIG. 5).

After the smoothing process, measurement of the surface profile of the $SiO_2$ bonding layer 22 using an atomic force microscope (AFM) resulted in a roughness Ra=0.3 nm.

[Process of Preparing Supporting Diamond Substrate]

Next, the process of preparing a supporting diamond substrate will be described with reference to FIGS. 6, and 14 to 20.

Here, FIGS. 14, 15, and 17 to 20 are cross-sectional views illustrating example states during the process of preparing a supporting diamond substrate.

Figure 14:
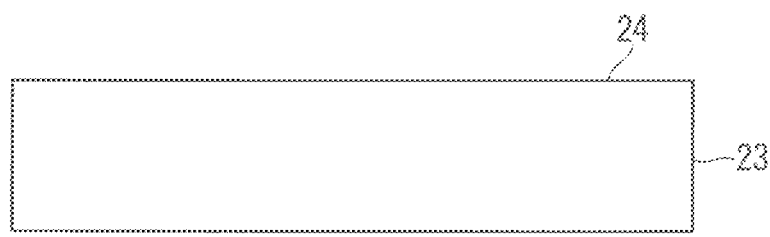
FIG. 14 is a cross-sectional view illustrating an example state during the process of preparing a supporting diamond substrate according to the embodiment.

As illustrated in the example of FIG. 14, a diamond wafer is prepared (Step ST21 in FIG. 6).

Specifically, a polycrystalline diamond wafer 23 with a diameter of 2 inches and a thickness of 300 µm is prepared.

Both of the upper and lower surfaces of the polycrystalline diamond wafer 23 are mirror polished. Particularly, a smoothing process is precisely performed by CMP on a polished surface 24 that is the upper surface of the polycrystalline diamond wafer 23.

After the smoothing process, evaluation of the surface profile of the polished surface 24 using the AFM resulted in a roughness Ra=0.5 nm.

Figure 15:
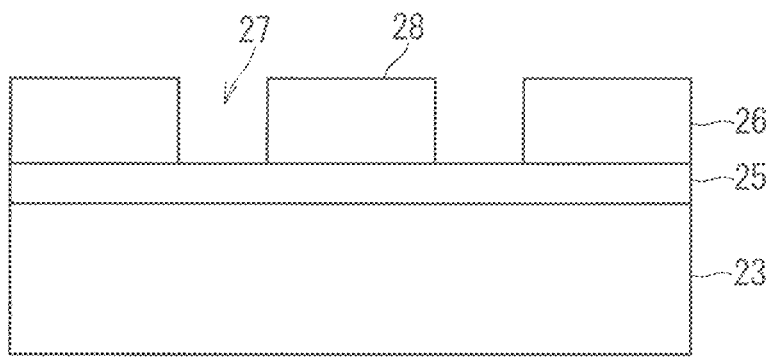
FIG. 15 is a cross-sectional view illustrating an example state during the process of preparing a supporting diamond substrate according to the embodiment.

Next, a protective SiN film 25 is formed (Step ST22 in FIG. 6). As illustrated in the example of FIG. 15, photolithography is performed on the structure (Step ST23 in FIG. 6).

Specifically, a SiN film (i.e., the protective SiN film 25) is formed by plasma CVD, for example, with a thickness of 400 nm on the polished surface 24 of the polycrystalline diamond wafer 23.

Then, a photoresist is formed on the upper surface of the protective SiN film 25, and general photolithographic processes such as pattern exposure and development are performed thereon. Next, a resist mask 26 is formed on the upper surface of the protective SiN film 25.

Figure 16:
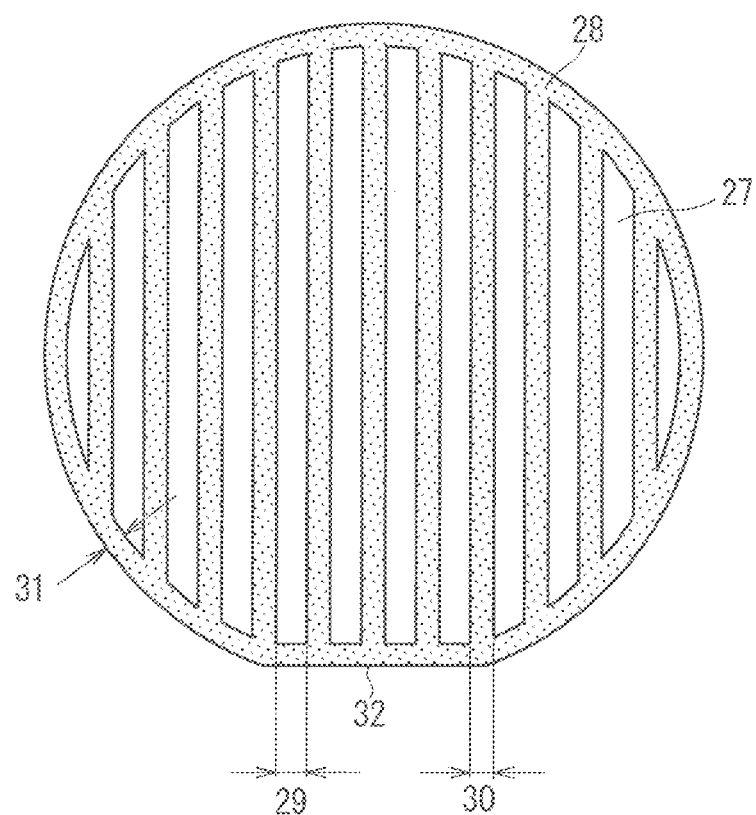
FIG. 16 is a plan view schematically illustrating an example resist mask pattern fabricated in the embodiment.

FIG. 16 is a plan view schematically illustrating an example resist mask pattern fabricated in Embodiment 1.

As illustrated in the example of FIG. 16, the resist mask includes a mask portion 28 and openings 27. The resist mask pattern includes a stripe pattern orthogonal to an orientation flat 32 of the polycrystalline diamond wafer 23, and a circumference pattern along the periphery 10 of the polycrystalline diamond wafer 23.

FIG. 16 illustrates relative proportions of the dimensions and the number of stripes differently from the actual values for convenience of the description. In Embodiment 1, an opening width 29 of the resist mask pattern is 10 µm, a mask portion width 30 is 50 µm, and a peripheral mask portion width 31 is 200 µm.

Next, the protective SiN film 25 is etched through the resist mask 26 (Step ST24 in FIG. 6).

Figure 17:
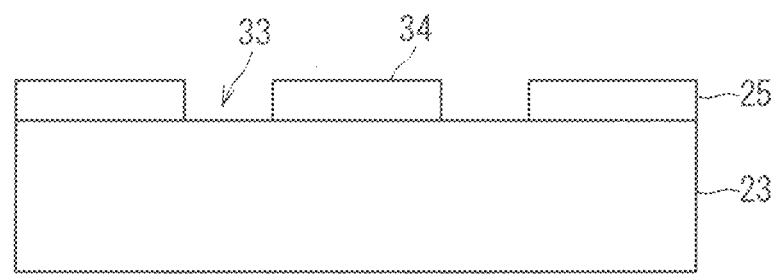
FIG. 17 is a cross-sectional view illustrating an example state during the process of preparing a supporting diamond substrate according to the embodiment.

In Embodiment 1, the etching is performed by the RIE using a mixed gas of $CF_4$ and $O_2$. Then, removal of the resist mask 26 can produce a pattern of the protective SiN film 25 in which SiN mask openings 33 and a SiN mask portion 34 are formed as illustrated in the example of FIG. 17, on the upper surface of the polycrystalline diamond wafer 23.

The etching using the RIE needs to consider not only the thickness direction but also change in the pattern width due to side etching. The SiN mask opening 33 and the SiN mask portion 34 are 10 µm and 50 µm wide, respectively, that are identical in width to the resist mask pattern, under the conditions used in Embodiment 1.

The upper surface of the polycrystalline diamond wafer 23 that is exposed at the bottom of the SiN mask openings 33 is slightly damaged in the etching using the RIE. Since this portion is a portion to be etched in the latter process, the damage is negligible.

Although the protective SiN film 25 is etched by the RIE, the method is not limited to the RIE but may be, for example, wet etching.

Figure 18:
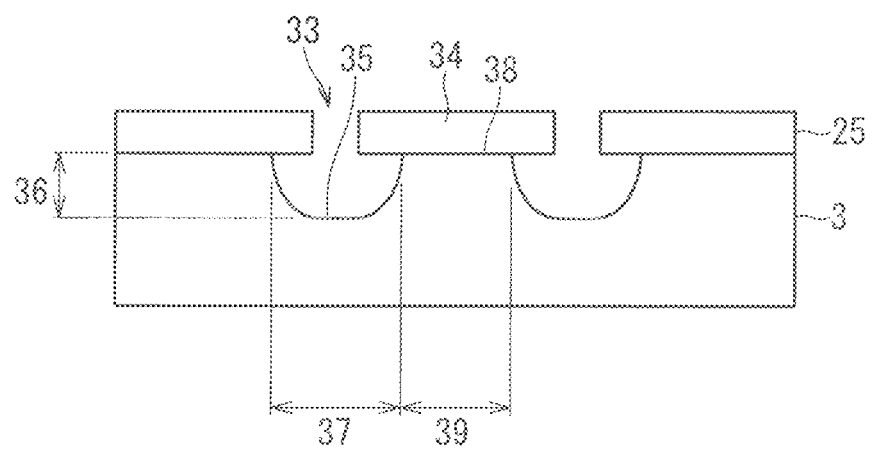
FIG. 18 is a cross-sectional view illustrating an example state during the process of preparing a supporting diamond substrate according to the embodiment.

Next, the supporting diamond substrate 3 is obtained by etching the upper surface of the polycrystalline diamond wafer 23 using the protective SiN film 25 as a mask as illustrated in the example of FIG. 18 (Step ST25 in FIG. 6). In Embodiment 1, the RIE using $O_2$ is applied.

Through the etching, the machined grooves 35 are formed below the SiN mask openings 33. The machined grooves 35 are located more inward than the periphery 10 in a plan view of the supporting diamond substrate 3. A machined depth 36 of the machined grooves 35 is, for example, 10 µm.

The etching is performed in Embodiment 1 under conditions of a relatively high gas pressure and reduction in ion bombardment components on the etching surface to maintain a high etch rate ratio (i.e., maintain a large difference in etch rate) between the protective SiN film 25 and the polycrystalline diamond wafer 23.

Thus, side etching proceeds approximately 5 µm long in the lateral direction in the polycrystalline diamond wafer 23 located below the protective SiN film 25. A machined width 37 of the machined groove 35 is, for example, 20 µm which is greater than the width of the SiN mask opening 33, in greater than or equal to 90% of a region of the grooves 35 in the longitudinal direction.

As a result, a non-etched region, that is, a surface maintaining the initial diamond polished surface (referred to as a terrace portion 38) has a terrace portion width 39 of, for example, 40 µm. Specifically, an interval between the adjacent grooves 35 ranges between 0.1 m and 100 µm in greater than or equal to 90% of the region of the grooves 35 in the longitudinal direction. Since the periphery 10 is 200 m thick with reference to FIGS. 4 and 16, the thickness of the periphery 10 is more than double the machined width 37 of the machined groove.

Although the RIE using $O_2$ is applied to etch the polycrystalline diamond wafer 23 in Embodiment 1, the etching method is not limited to this.

Figure 19:
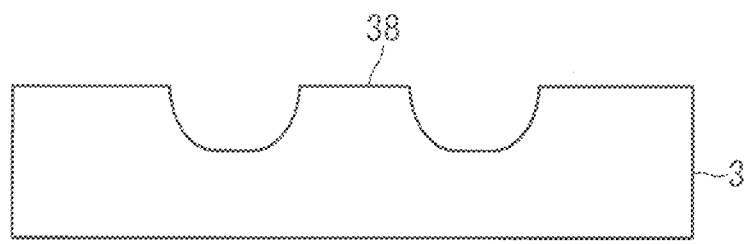
FIG. 19 is a cross-sectional view illustrating an example state during the process of preparing a supporting diamond substrate according to the embodiment.

Next, the structure illustrated in FIG. 18 is immersed in a hydrofluoric acid aqueous solution to remove the protective SiN film 25 as illustrated in the example of FIG. 19 (Step ST26 in FIG. 6).

Since the surface profile of the terrace portion 38 is identical to that of the polished surface 24 of the polycrystalline diamond wafer 23 obtained in Step ST21 in FIG. 6, for example, the roughness Ra=0.5 nm is maintained.

Figure 20:
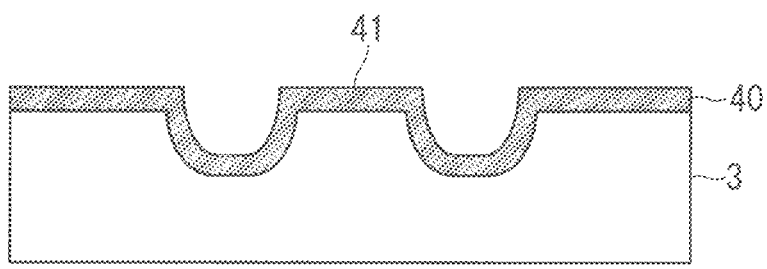
FIG. 20 is a cross-sectional view illustrating an example state during the process of preparing a supporting diamond substrate according to the embodiment.

Next, a $SiO_2$ bonding layer 40 with a thickness of 1 µm is formed by CVD using the TEOS on the upper surface of the supporting diamond substrate 3 with the machined grooves as illustrated in the example of FIG. 20 (Step ST27 in FIG. 6). Then, the $SiO_2$ bonding layer 40 is thermally treated in a nitrogen atmosphere at 700° C.

As a result of measurement of the surface profile of a terrace portion 41 after the thermal treatment, for example, the roughness Ra=0.5 nm was maintained.

Depending on the deposition conditions for $SiO_2$ or the thermal treatment conditions, the surface roughness of the terrace portion 41 may become deteriorated. In such a case, the upper surface of the terrace portion 41 of the $SiO_2$ bonding layer 40 can be precisely polished by CMP as indicated by Step ST28 in FIG. 6.

As such, the supporting diamond substrate 3 with the $SiO_2$ bonding layer 40 formed is completed (Step ST29 in FIG. 6). The $SiO_2$ bonding layer 40 is formed along the inner wall of the machined grooves 35, and does not fill in space 43 enclosed by the inner wall of the machined grooves 35.

[Process of Fabricating Composite Substrate]

Next, the process of fabricating a composite substrate will be described with reference to FIGS. 7, 21, and 22.

Figure 21:
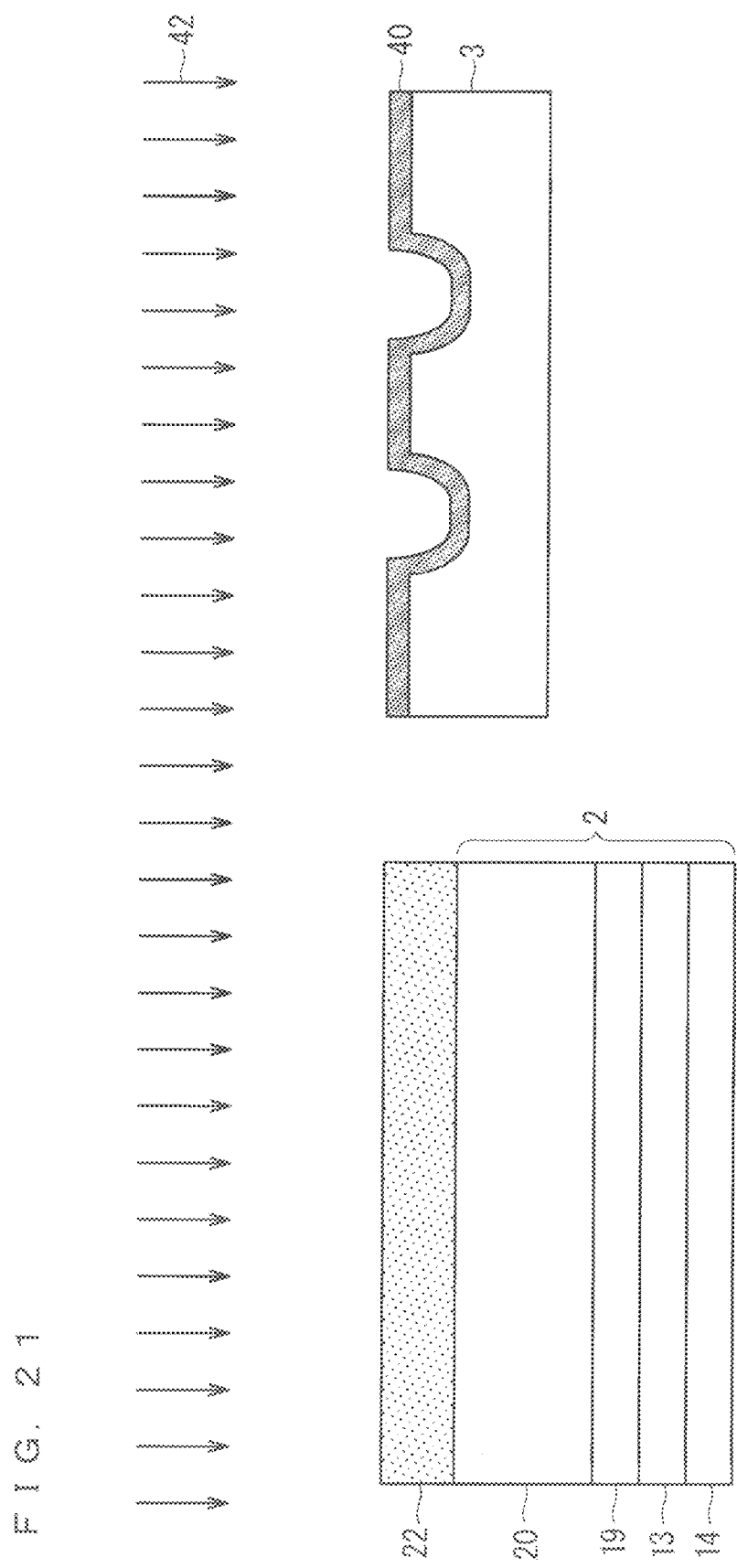
FIG. 21 is a cross-sectional view illustrating an example state during the process of fabricating a composite substrate according to the embodiment.
Figure 22:
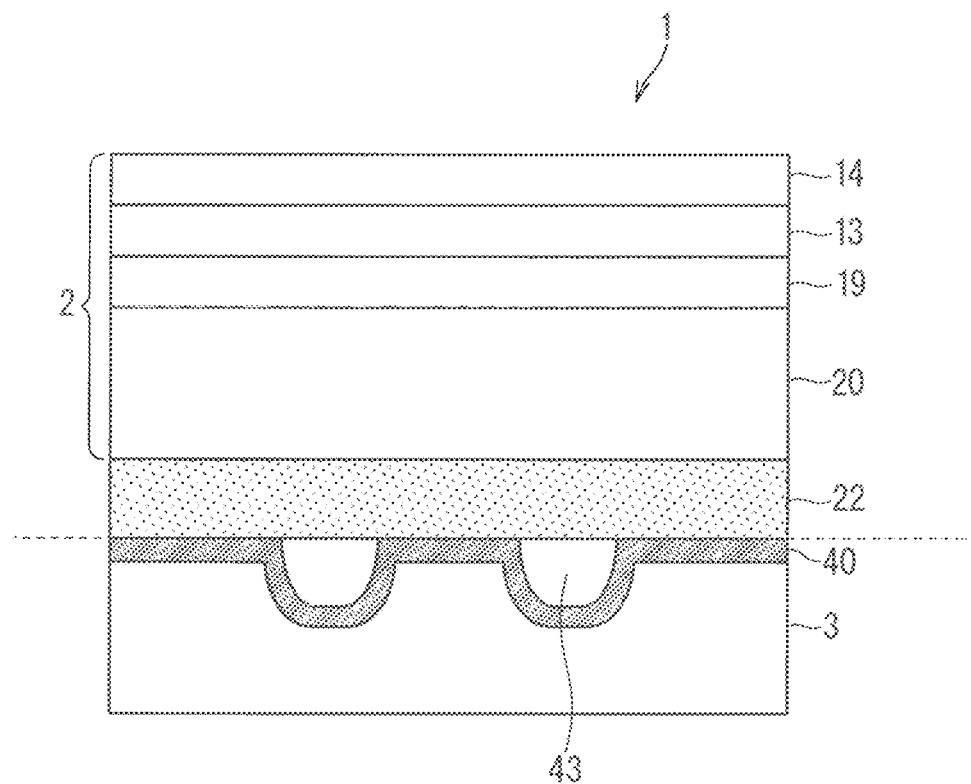
FIG. 22 is a cross-sectional view illustrating an example state during the process of fabricating a composite substrate according to the embodiment.

Here, FIGS. 21 and 22 are cross-sectional views illustrating example states during the process of fabricating a composite substrate.

First, the $SiO_2$ bonding layer 22 formed on the upper surface of the GAN-on-diamond substrate 2 and the $SiO_2$ bonding layer 40 formed on the upper surface of the supporting diamond substrate 3 are treated with oxygen plasma 42 as illustrated in the example of FIG. 21 (Step ST31 in FIG. 7).

This activates the surfaces of the $SiO_2$ bonding layers. Further, the $SiO_2$ bonding layers are hydrophilic through absorption of water in the air.

Although the oxygen plasma treatment is performed in Embodiment 1, plasma treatment using inert gas such as argon or nitrogen may be performed. Alternatively, the surfaces of the $SiO_2$ bonding layers may be cleaned with pure water for performing hydrophilic treatment more completely.

Next, the surfaces of the $SiO_2$ bonding layers that become hydrophilic in Step ST31 are brought in contact with each other in the air, and are bonded together as illustrated in the example of FIG. 22 (Step ST32 in FIG. 7). Here, the $SiO_2$ bonding layers 40 and 22 are bonded together in a region except the machined grooves 35.

As such, bringing the $SiO_2$ bonding layers in contact with each other in the air allows the GAN-on-diamond substrate 2 to be fixed to the supporting diamond substrate 3 through a hydrogen bond via water molecules absorbed on the surfaces.

Since the contact area affects the adhesion strength, increase in the adhesion strength requires smoothing the surfaces to be in contact with each other. In Embodiment 1, the $SiO_2$ bonding layers to be in contact with each other have roughness of Ra=0.3 nm and Ra=0.5 nm, thus having enough smoothness for bonding.

In Embodiment 1, both of the GAN-on-diamond substrate 2 and the supporting diamond substrate 3 are transparent to visible light. Thus, contrast differences between a region with appropriate bonding (i.e., a bonded region) and a region without bonding (a region with voids between the $SiO_2$ bonding layers. i.e., a non-bonded region) can be recognized through visual observation.

Once the $SiO_2$ bonding layers are brought in contact with each other in the air, a state where the bonded region voluntarily extends from a portion at which the $SiO_2$ bonding layers come initially in contact with each other as a starting point can be observed through the visual observation.

The contrast differences caused by the presence or absence of the bonding are sometimes not discernible due to a laminated structure of a plurality of transparent films. Moreover, the contrast differences are sometimes not discernible due to formation of a non-bonded region with a cyclical ditch structure. However, Embodiment 1 enabled observation of the contrast differences which are sufficiently discernible.

When the GAN-on-diamond substrate 2 or the supporting diamond substrate 3 is warped, the bonded region does not sometimes voluntarily extend.

If so, application of pressure from outside of the substrate using, for example, a roller can forcibly bring the $SiO_2$ bonding layers in contact with each other and bond them together.

When substrates are bonded together in the air, generally, the air is sandwiched between the bonded surfaces and isolated, and is confined and does not escape in some cases. This creates a non-bonded region (i.e., voids) as a bonding defect.

However, the space 43 cyclically formed by the machined grooves 35 according to Embodiment 1 brings advantages of allowing the air to escape to the space 43 and not to be isolated between the bonded surfaces.

Since the capacity of the space 43 is sufficiently larger than the amount of the air to be sandwiched, increase in the atmospheric pressure inside never impairs the bonding.

Next, the bonded substrates are thermally treated in a nitrogen atmosphere at 400° C. (Step ST33 in FIG. 7).

This releases water molecules from a hydrogen bonding portion at the bonding interface. The water molecules are changed to a siloxane bond through oxygen atoms. Thus, the adhesion strength is significantly improved.

Although the air contained in the space 43 after the thermal treatment expands and the pressure increases, the phenomenon never impairs the bonding.

Through these processes, the composite substrate 1 according to Embodiment 1 is completed (Step ST34 in FIG. 7). The composite substrate 1 illustrated in FIG. 22 is the same as the composite substrate 1 illustrated in FIGS. 1 and 2.

The substrate bonding method involving the hydrophilic treatment, which is described in Steps ST32 and ST33 in FIG. 7, can be applied to a method for bonding the supporting substrate bonding layer 16 and the supporting substrate 17 in FIG. 10.

Since the supporting substrate bonding layer 16 and the supporting substrate 17 are flat substrates without any groove, attention should be given to possible occurrence of a bonding defect caused by sandwiching the air when the supporting substrate bonding layer 16 and the supporting substrate 17 are bonded together in the air.

Since both of the Si substrate 11 and the supporting substrate 17 are opaque to visible light, near infrared light needs to be used in evaluating a bonded region through visual observation.

For example, the presence or absence of a bonding defect can be recognized from contrast differences which are made by light transmitted from a halogen lamp used as a light source. The light is captured by a CCD camera that does not include an infrared cut-off filter.

[Process of Forming GAN-On-Diamond Transistor]

Next, the process of forming a GAN-on-diamond transistor will be described with reference to FIGS. 8, and 23 to 26.

Here, FIGS. 23 to 26 are cross-sectional views illustrating example states during the process of forming a GAN-on-diamond transistor.

Figure 23:
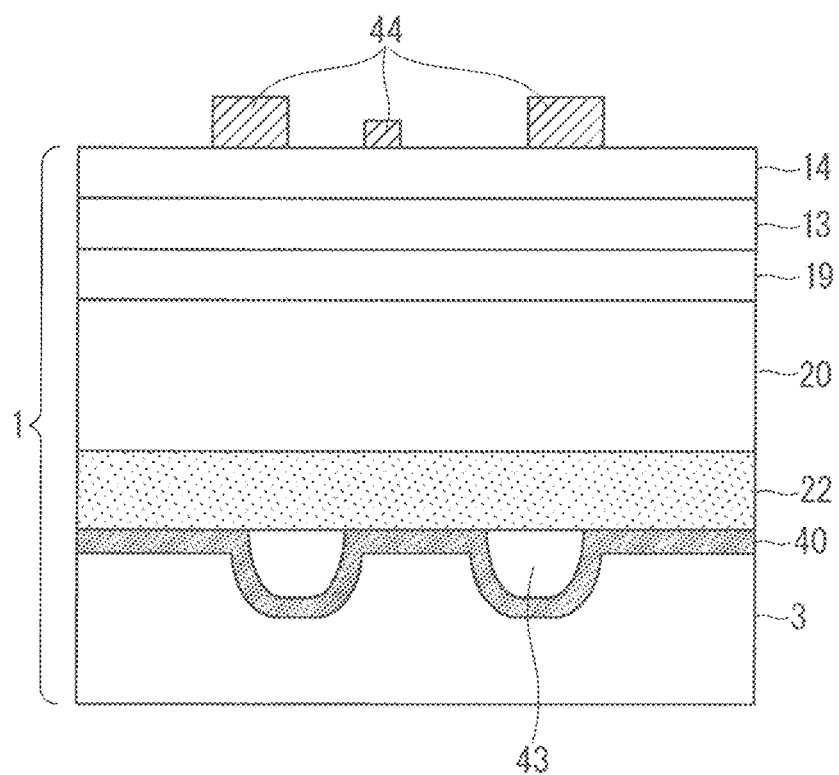
FIG. 23 is a cross-sectional view illustrating an example state during the process of forming a GAN-on-diamond transistor according to the embodiment.

First, transistor processes are applied to the composite substrate 1 as illustrated in the example of FIG. 23 (Step ST41 in FIG. 8). Although details of the transistor processes are not described herein, the transistor processes include ion implantation processes for device isolation, processes of forming a thin-film metal electrode, thermal treatment processes for forming an ohmic contact, processes of forming a surface protective SiN film, photolithographic processes for forming patterns, and wet etching processes or dry etching processes for forming patterns.

FIG. 23 schematically illustrates a state where electrodes 44 included in a transistor are formed on the AlGaN film 14 and the GaN film 13 that form an upper surface of the composite substrate 1.

Figure 24:
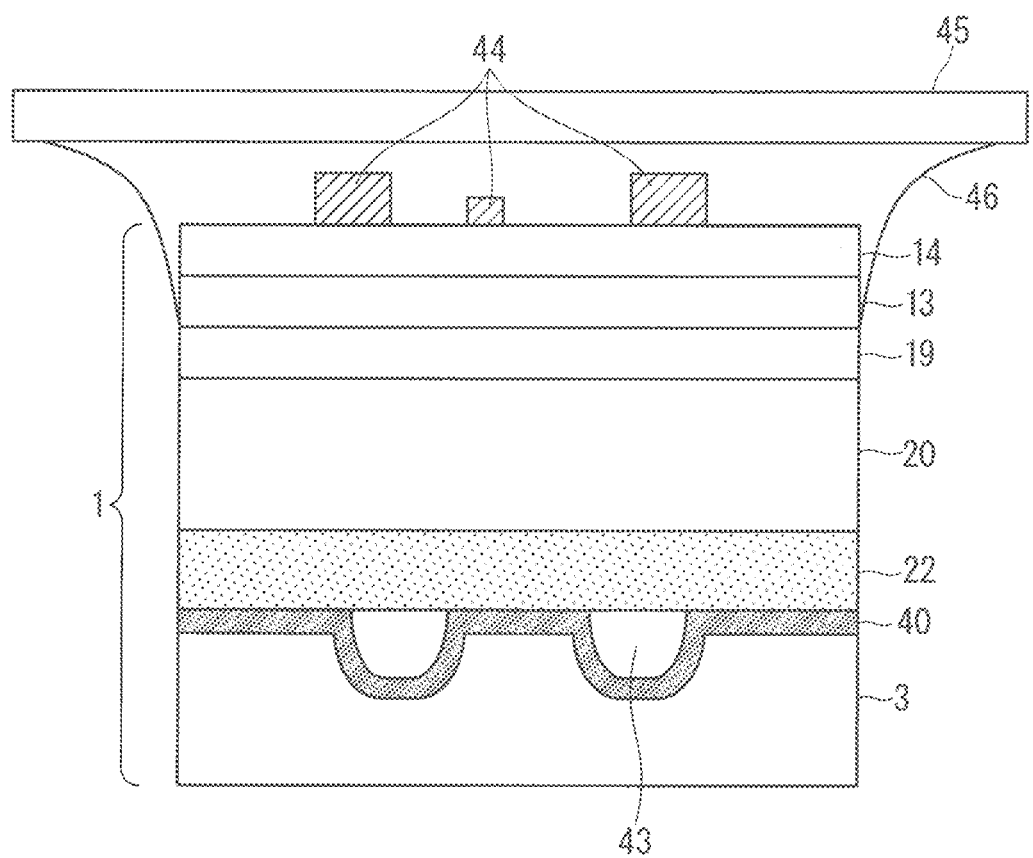
FIG. 24 is a cross-sectional view illustrating an example state during the process of forming a GAN-on-diamond transistor according to the embodiment.

Next, supporting sapphire glass 45 is bonded to the composite substrate 1 on which the transistor is formed, as illustrated in the example of FIG. 24 (Step ST42 in FIG. 8).

The object of bonding the supporting sapphire glass 45 to the composite substrate 1 is to hold the substrates in removing the supporting diamond substrate 3 in the composite substrate 1.

In Embodiment 1, the supporting sapphire glass 45 larger in diameter (e.g., 3 inches) than the composite substrate 1 is bonded with thermoplastic wax 46 as illustrated in the example of FIG. 24.

The reason why the sapphire glass is used is to prevent damage in immersion in a hydrofluoric acid aqueous solution in the latter process.

Figure 25:
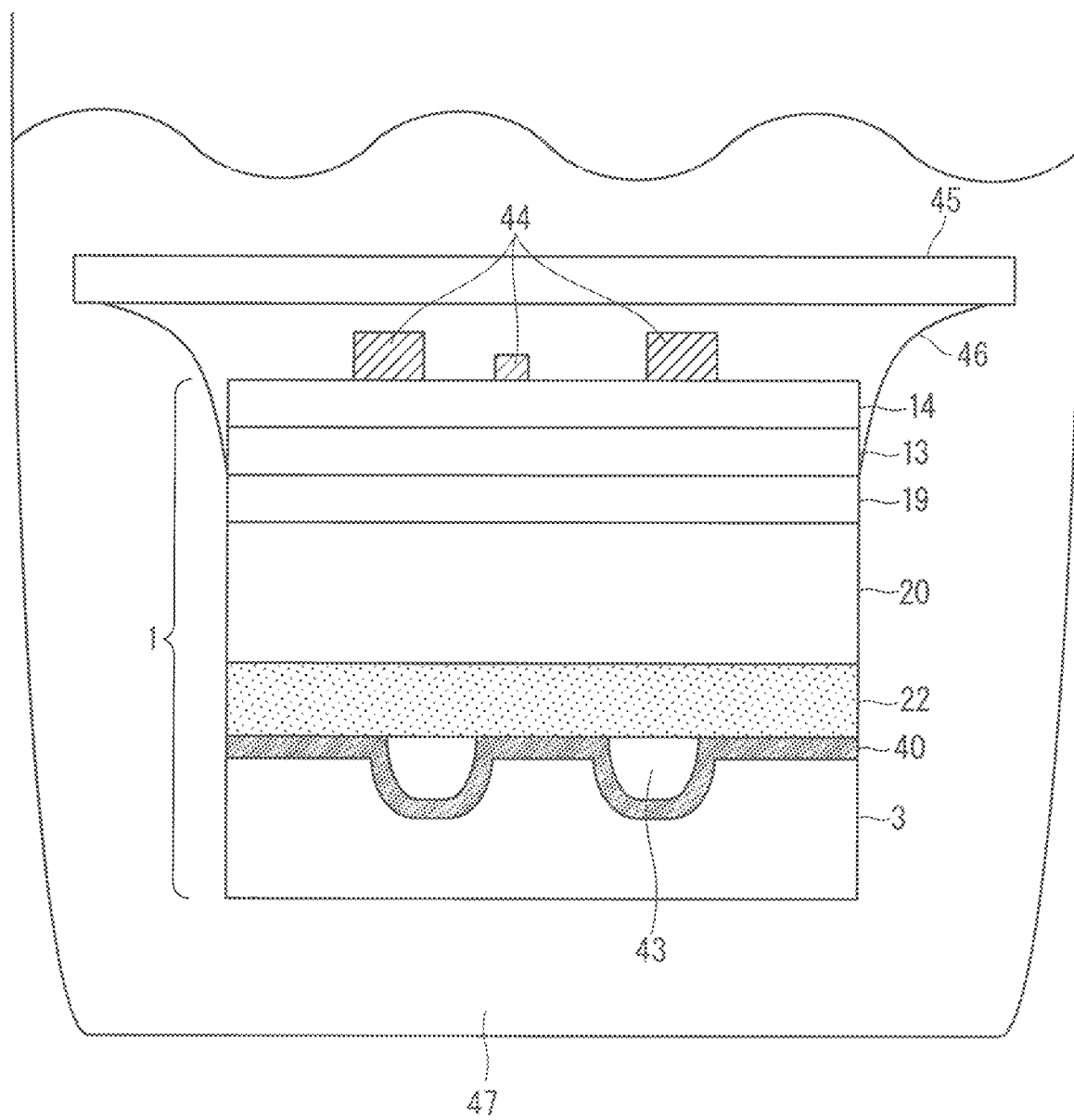
FIG. 25 is a cross-sectional view illustrating an example state during the process of forming a GAN-on-diamond transistor according to the embodiment.

Next, the composite substrate 1 bonded to the supporting sapphire glass 45 is immersed in a hydrofluoric acid aqueous solution 47 as illustrated in the example of FIG. 25, and the supporting diamond substrate 3 is removed (Step ST43 in FIG. 8).

Figure 26:
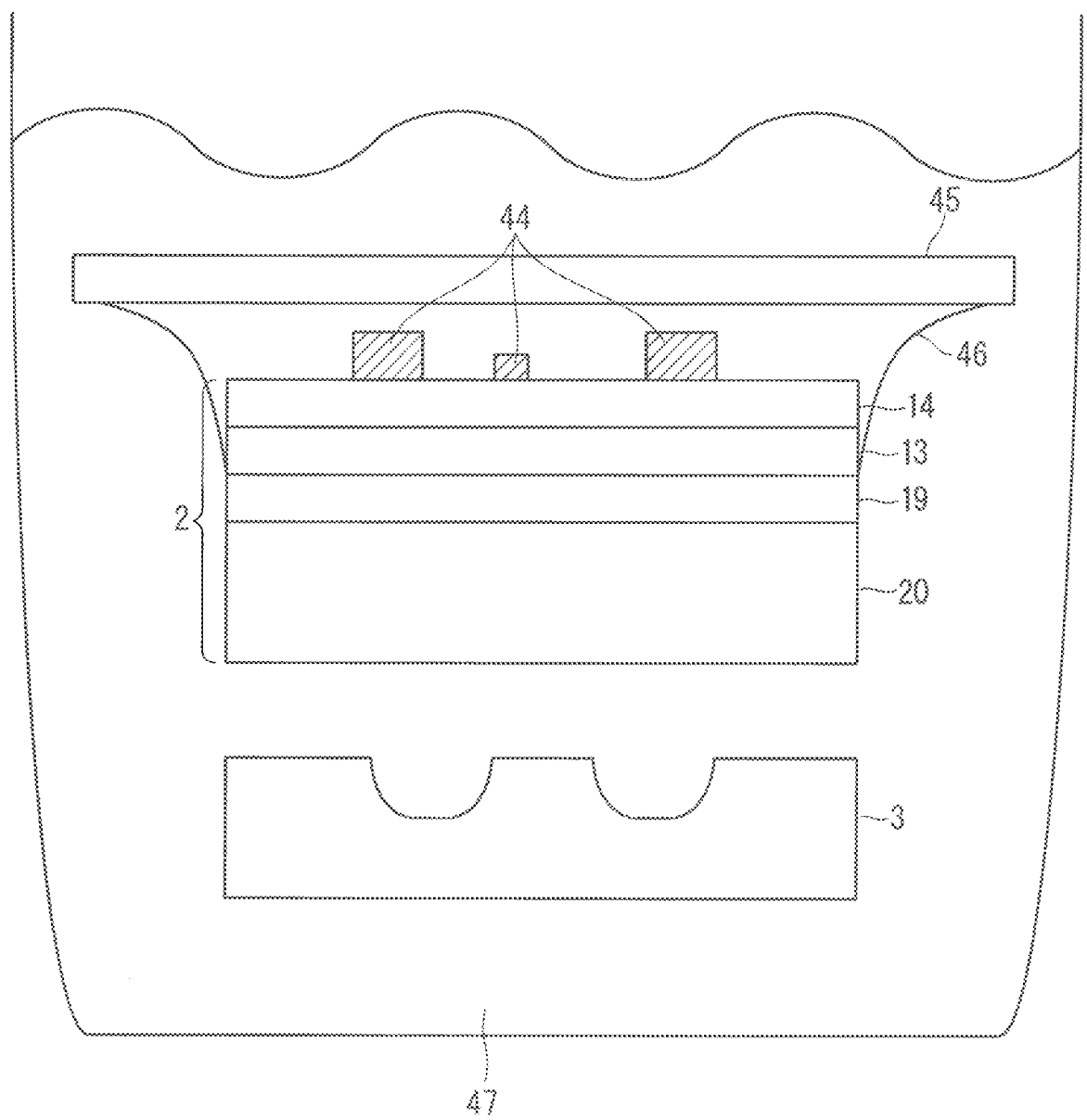
FIG. 26 is a cross-sectional view illustrating an example state during the process of forming a GAN-on-diamond transistor according to the embodiment.

Since both of the $SiO_2$ bonding layers 22 and 40 are soluble in the hydrofluoric acid aqueous solution 47, these bonding layers are dissolved and removed through this process as illustrated in the example of FIG. 26.

As illustrated in the example of FIG. 26, the composite substrate 1 is separated into the GAN-on-diamond substrate 2 to which the supporting sapphire glass 45 is attached, and the supporting diamond substrate 3 from which the $SiO_2$ bonding layer 40 has been removed.

Then, the wax 46 is softened by heating the supporting sapphire glass 45 on a hot plate. Next, the GAN-on-diamond transistor (i.e., a structure in which, for example, the electrodes 44 included in the transistor are formed on the upper surface of the GAN-on-diamond substrate 2) is removed from the supporting sapphire glass 45.

Afterward, the wax 46 adhering to the GAN-on-diamond transistor is completely removed with acetone. As such, the GAN-on-diamond transistor is completed (Step ST44 in FIG. 8).

[Space]

Next, the significance of the space 43 formed by the machined grooves 35 in the composite substrate 1 according to Embodiment 1 will be described.

Figure 27:
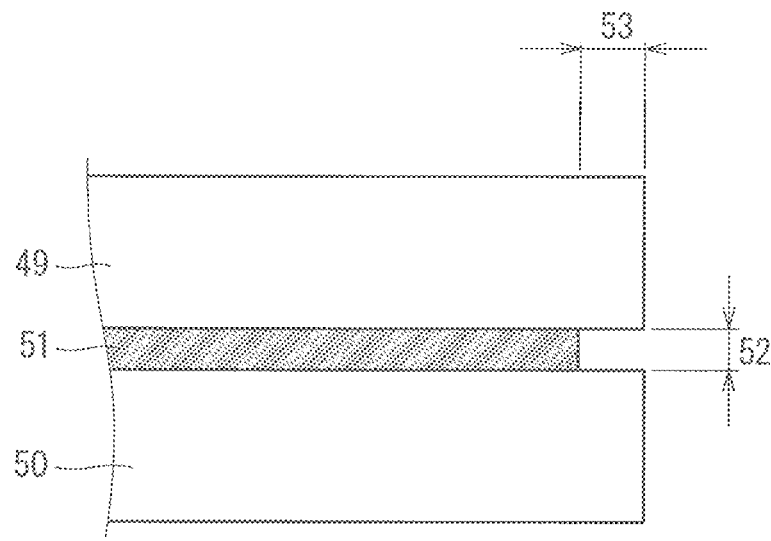
FIG. 27 is a cross-sectional view illustrating an example structure without space formed by grooves according to Comparative Example.

FIG. 27 is a cross-sectional view illustrating a structure without space formed by grooves according to Comparative Example, that is, an example structure of a composite substrate in which two substrates are bonded together through a thin-film bonding layer.

Specifically, a Si substrate 49 located upward and a Si substrate 50 located downward are bonded together through a $SiO_2$ bonding layer 51. A film thickness 52 of the $SiO_2$ bonding layer 51 is 2 μm.

FIG. 27 illustrates the composite substrate which includes the Si substrate 49 and the Si substrate 50 and which has been immersed in a hydrofluoric acid aqueous solution whose concentration is 50 wt %, for a certain period of time. Thus, the $SiO_2$ bonding layer 51 is etched by an etching distance 53 from the end portion of the composite substrate in FIG. 27. The etching distance 53 was 100 μm per hour of immersion. This is a value as high as a generally known etch rate of $SiO_2$ (1.5 μm per minute in a hydrofluoric acid aqueous solution whose concentration is 50 wt %). A simple calculation using this value clarifies that it takes 280 hours to perform a process for setting the etching distance to 25 mm for removing a substrate of 2 inches, that is, a substrate with a diameter of 50 mm. This time length is not industrially valid.

Figure 28:
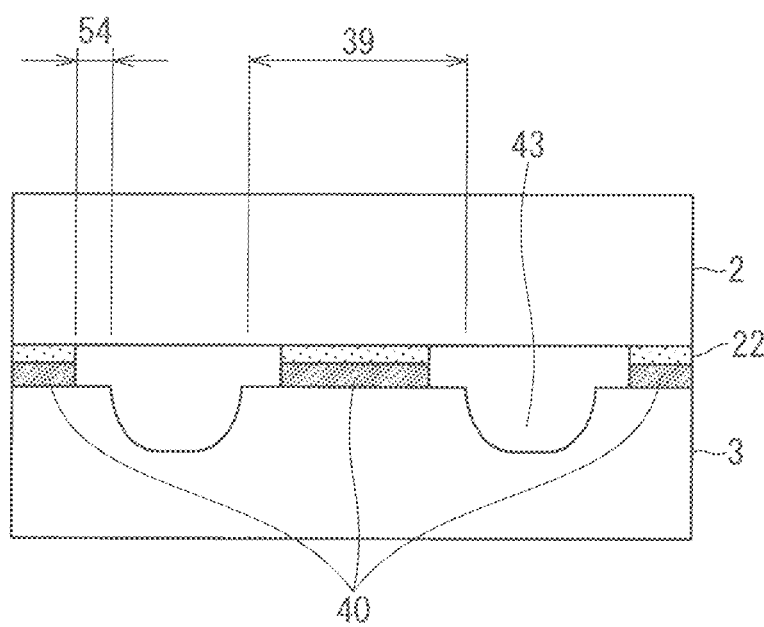
FIG. 28 is a cross-sectional view illustrating an example structure of the composite substrate according to the embodiment.

In contrast, FIG. 28 is a cross-sectional view illustrating an example structure of the composite substrate including the supporting diamond substrate 3 and the GAN-on-diamond substrate 2 according to Embodiment 1. FIG. 28 illustrates the composite substrate immersed in a hydrofluoric acid aqueous solution whose concentration is 50 wt %, for a certain period of time.

Once the hydrofluoric acid aqueous solution fills in the space 43 formed by the machined grooves 35, the increasing rate of an etching distance 54 is equal to that of the etching distance 53 according to Comparative Example illustrated in FIG. 27.

In Embodiment 1, portions of the $SiO_2$ bonding layers 40 and 22 corresponding to the terrace portion width 39 should be etched for removing the supporting diamond substrate 3 from the GAN-on-diamond substrate 2. Since the terrace portion width 39 is 40 μm in Embodiment 1, 20 μm of the portions which corresponds to a half the terrace portion width 39 should be etched. In a simple calculation, it takes 13 minutes to complete the etching and enable removing of the supporting diamond substrate 3 from the GAN-on-diamond substrate 2.

Here, the space 43 formed by the machined grooves 35 needs to function as fluid channels extending to the end portion of the supporting diamond substrate 3 so that the hydrofluoric acid aqueous solution fills in the space 43.

Although the width of the space 43 is set to 20 μm with respect to 40 μm of the terrace portion width in Embodiment 1, the dimensions are not limited to these.

Specifically, narrowing the terrace portion width shortens the time required to remove the supporting diamond substrate 3. However, excessively narrowing the terrace portion width causes the terrace portion to fall and be easily damaged.

On the other hand, widening the terrace portion width increases the adhesion strength between the GAN-on-diamond substrate 2 and the supporting diamond substrate 3. However, when the terrace portion width is greater than 100 μm, the adhesion strength is not significantly improved, and even the time required to remove the supporting diamond substrate 3 is prolonged. In view of these, the terrace portion width preferably ranges between 0.1 μm and 100 μm.

The hydrofluoric acid aqueous solution that is a chemical solution needs to infiltrate the space 43 formed by the machined grooves 35. It has been affirmed that the hydrofluoric acid aqueous solution does not sufficiently infiltrate the space 43 when the width of the space 43 is narrowed. In Embodiment 1, the hydrofluoric acid aqueous solution did not infiltrate the space 43 when the width of the space 43 was narrower than 1 μm.

On the other hand, excessively widening the space 43 creates a problem of curvatures in the GAN-on-diamond substrate 2 and the supporting diamond substrate 3 that are included in the composite substrate, and a problem that the GAN-on-diamond substrate 2 and the supporting diamond substrate 3 stick to each other midway in the space 43. In view of these, the width of the space 43 preferably ranges between 1 μm and 1 mm.

As described above, when the space 43 functions as fluid channels and the hydrofluoric acid aqueous solution fills in the space 43, removal of the supporting diamond substrate 3 should be facilitated. However, the immersion time required to remove the supporting diamond substrate 3 was sometimes much longer than an assumed time in Embodiment 1.

It can be estimated that the wettability of the wall surface of the machined grooves 35 and interchange of the air filling in the space 43 earlier with the hydrofluoric acid aqueous solution which will fill in the space 43 later are challenges for infiltration of the hydrofluoric acid aqueous solution into the relatively narrow space 43 functioning as fluid channels.

In Embodiment 1, 0.1 wt % of a nonionic surface active agent is added to the hydrofluoric acid aqueous solution for improving the wettability of the wall surface of the machined grooves 35 in the challenges.

Furthermore, an immersion container is placed in a reduced pressure environment for promoting the infiltration of the hydrofluoric acid aqueous solution into the space 43. In the reduced pressure environment, the air filling in the space 43 functioning as fluid channels is discharged to the outside of the space 43. Thus, the hydrofluoric acid aqueous solution easily fills in the space 43.

Although both of addition of the surface active agent and the immersion under a reduced pressure are performed in Embodiment 1, one of them may be performed, or none of them needs to be performed. The type of the surface active agent to be added is not limited to the aforementioned type.

We found that even when the surface active agent is added, the immersion time required to remove the supporting diamond substrate 3 was sometimes much longer than the assumed time. This is particularly noticeable when the immersion container is not placed in a reduced pressure environment.

Figure 29:
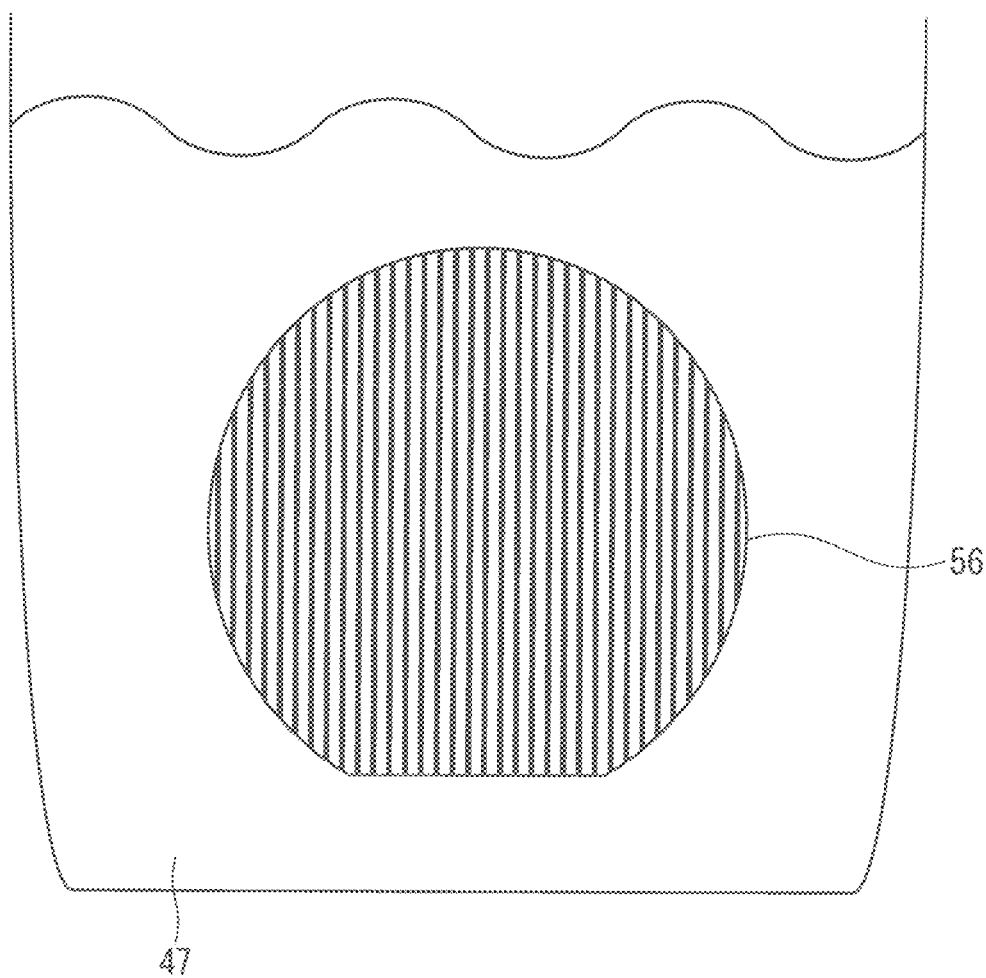
FIG. 29 illustrates a state where a composite substrate is immersed in a hydrofluoric acid aqueous solution.

FIG. 29 illustrates a state where a composite substrate 56 is immersed in the hydrofluoric acid aqueous solution 47. Although FIG. 29 illustrates fluid channels on the substrate surface for facilitating the understanding, the fluid channels cannot be actually recognized from the outside of the composite substrate 56 as being sandwiched between substrates.

In FIG. 29, the composite substrate 56 is immersed in the hydrofluoric acid aqueous solution 47, with the fluid channels extending in a direction orthogonal to the fluid level of the solution.

Figure 30:
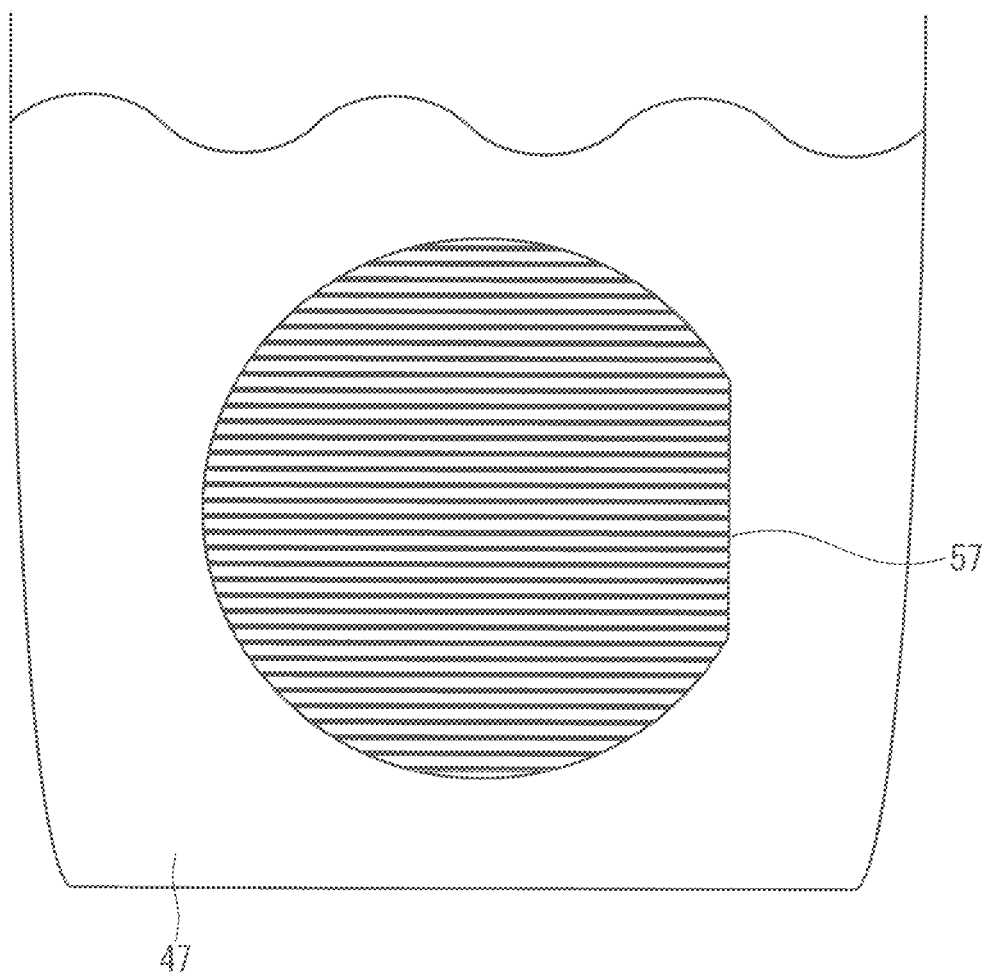
FIG. 30 illustrates a state where a composite substrate is immersed in the hydrofluoric acid aqueous solution.

FIG. 30 illustrates a state where a composite substrate 57 is immersed in the hydrofluoric acid aqueous solution 47. Although FIG. 30 also illustrates fluid channels on the substrate surface for facilitating the understanding, the fluid channels cannot be actually recognized from the outside of the composite substrate 57 as being sandwiched between substrates.

In FIG. 30, the composite substrate 57 is immersed in the hydrofluoric acid aqueous solution 47, with the fluid channels extending parallel to the fluid level of the solution.

The experiments of the Inventors revealed that when the composite substrate 57 is immersed in the hydrofluoric acid aqueous solution 47 with the fluid channels extending parallel to the fluid level of the solution as illustrated in FIG. 30, removal of the supporting diamond substrate 3 is significantly delayed, that is, the immersion time required to remove the supporting diamond substrate 3 is longer than the assumed time.

The reason why the time required to remove the supporting diamond substrate 3 varies depending on the direction in which the composite substrate is placed is because infiltration of a chemical solution into fluid channels is derived from a difference in density between the chemical solution and the air.

Specifically, since the air is lower in density than the chemical solution, in FIG. 29, the air escapes from the upper portion of the fluid channels to the hydrofluoric acid aqueous solution 47, and instead, the hydrofluoric acid aqueous solution 47 infiltrates from the lower portion of the fluid channels (an orientation flat in FIG. 29). As a result, the removal of the supporting diamond substrate 3 proceeds from the lower portion of the composite substrate 56.

The experiments of the Inventors confirmed a disbond at a lower portion of the composite substrate 56 once the immersion was suspended during removal of the supporting diamond substrate 3 and the composite substrate 56 was observed through infrared transmission light.

In contrast, since both ends of the fluid channels do not have any height difference (difference in depth with respect to the fluid level of the hydrofluoric acid aqueous solution 47) even though with a difference in density between the hydrofluoric acid aqueous solution 47 and the air in FIG. 30, release of the air and infiltration of the hydrofluoric acid aqueous solution 47 hardly occur. Thus, the time required to remove the supporting diamond substrate 3 is prolonged.

The experiments of the Inventors confirmed that a disbond hardly proceeded once the immersion was suspended during removal of the supporting diamond substrate 3 and the composite substrate 57 was observed through infrared transmission light.

In view of the phenomena, it is important to immerse the composite substrate with the fluid channels extending in the direction orthogonal to the fluid level of the hydrofluoric acid aqueous solution 47 as illustrated in FIG. 29, so that the supporting diamond substrate 3 is removed for a short period of time.

Alternatively, we found that not extending the fluid channels in one direction but placing the fluid channels of two directions in an intersecting shape (i.e., a lattice pattern) can shorten the time required to remove the supporting diamond substrate 3 no matter in which direction the fluid channels extend during the immersion.

Figure 33:
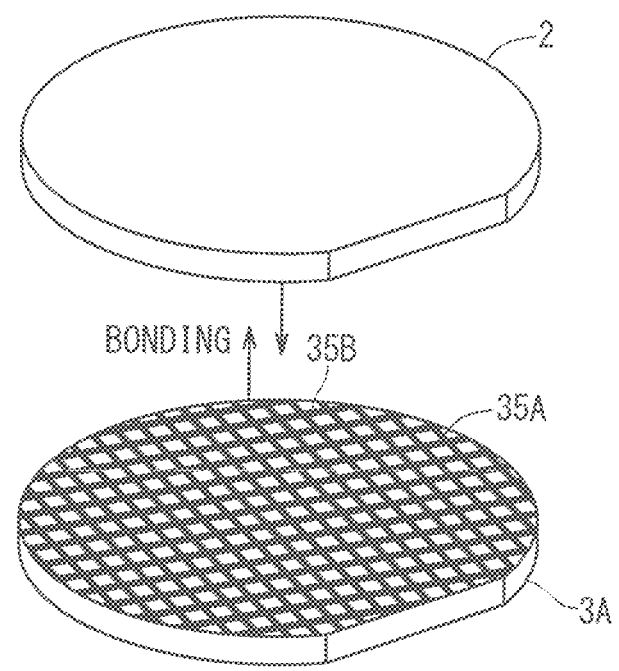
FIG. 33 illustrates another example of a semiconductor substrate and a supporting substrate that are included in a composite substrate according to the embodiment.

FIG. 33 illustrates another example of a semiconductor substrate and a supporting substrate that are included in a composite substrate according to Embodiment 1.

As illustrated in the example of FIG. 33, machined grooves 35A and machined grooves 35B extending in directions intersecting the machined grooves 35A are formed on a bonded surface of a supporting diamond substrate 3A with the GAN-on-diamond substrate 2. Here, a direction in which the machined groove 35A extends and a direction in which the machined groove 35B extends form an angle ranging, for example, between 10° and 90°.

Formation of an intersecting shape (a lattice pattern) of the fluid channels of the two directions using two types of the machined grooves creates a height difference between both ends of any one of the fluid channels, while the fluid channels extending in any of the directions are immersed in the hydrofluoric acid aqueous solution 47. Thus, the hydrofluoric acid aqueous solution 47 can infiltrate from the lower portion of the fluid channels.

In addition to the intersecting shape of the fluid channels, for example, radial fluid channels may be formed, or a junction portion may be formed in which a plurality of dotted terrace portions are bonded while the remaining areas function as fluid channels.

[Terrace Portion]

Since the machined grooves 35 are formed using the resist mask pattern whose example is illustrated in FIG. 16 in Embodiment 1, the terrace portion is formed across the entire circumference of the periphery 10 of the supporting diamond substrate 3. The space 43 is closed by the terrace portion formed across the entire circumference of the periphery 10. The significance of the terrace portion across the entire circumference will be hereinafter described.

As indicated in Step ST43 in FIG. 8, the supporting diamond substrate 3 is removed using the hydrofluoric acid aqueous solution 47. Before the process, the hydrofluoric acid aqueous solution is also used in the transistor processes in Step ST41 in FIG. 8.

Here, in a structure allowing the supporting diamond substrate 3 to be removed in a short period of time, the supporting diamond substrate 3 may be unintentionally removed in Step ST41 in FIG. 8 and may not function as a supporting substrate.

For preventing such a phenomenon, the terrace portion is formed across the entire circumference of the periphery 10 which allows adjustment of the time to start the removal in Embodiment 1. The terrace portion delays the immersing timing of the hydrofluoric acid aqueous solution in the space 43.

In Embodiment 1, the width of the terrace portion in a radial direction which is formed along the periphery 10 of the substrate is set to 200 μm. This can delay immersing of the hydrofluoric acid aqueous solution in the space 43 by approximately 120 minutes.

Although the width of the terrace portion in the radial direction is 200 μm in Embodiment 1, the width of the terrace portion in the radial direction is not limited to this value but may be changed as necessary.

Although the terrace portion is formed along the (extreme) periphery 10 of the substrate in Embodiment 1, the terrace portion may be formed in a position moved inward by a certain width from the extreme periphery of the substrate.

Generally, the pattern geometry of the end portion of the substrate may be disturbed due to an influence such as instability of the thickness of a resist film to be used in the photolithography. Thus, the terrace portion across the entire circumference may be formed more inward, for example, approximately 1 mm from the end portion of the substrate for avoiding this.

Embodiment 2

A method for manufacturing a composite substrate according to Embodiment 2, and the composite substrate will be described. In the following description, the same reference numerals are assigned to the same constituent elements already described in Embodiment 1, and the detailed description will be appropriately omitted.

[Structure of Composite Substrate]

Although the composite substrate according to Embodiment 2 is identical in shape to the composite substrate according to Embodiment 1, that is, the composite substrate illustrated in FIGS. 1, 2, and 22, the fluid channels are in a vacuum.

[Method for Manufacturing Composite Substrate]

Next, a method for manufacturing the composite substrate according to Embodiment 2 will be described.

Among all the four processes, i.e., the process of preparing a GAN-on-diamond substrate, the process of preparing a supporting diamond substrate, the process of fabricating a composite substrate, and the process of forming a GAN-on-diamond transistor, only the process of fabricating a composite substrate in Embodiment 2 differs from that described in Embodiment 1. Thus, the difference will be particularly described in detail.

[Process of Fabricating Composite Substrate]

The process of fabricating a composite substrate will be described with reference to FIGS. 31 and 32.

Figure 31:
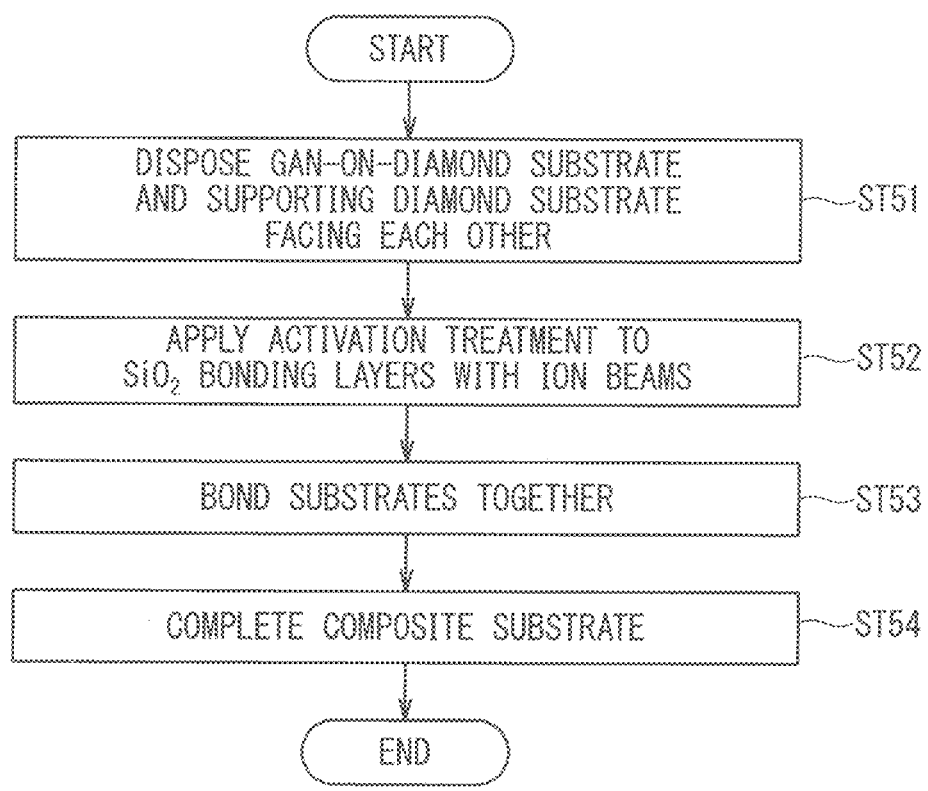
FIG. 31 is a flowchart illustrating a process of fabricating a composite substrate according to the embodiment.

Here, FIG. 31 is a flowchart illustrating the process of fabricating a composite substrate. Furthermore, FIG. 32 is a cross-sectional view illustrating an example state during the process of fabricating a composite substrate.

First, the GAN-on-diamond substrate 2 and the supporting diamond substrate 3 are disposed at a spacing with their bonded surfaces facing each other, in a bonder chamber 58 maintained in a high vacuum (Step ST51 in FIG. 31).

Then, activation treatment is applied to both of the bonded surfaces of the substrates, that is, the $SiO_2$ bonding layers 22 and 40 with ion beams 60 emitted from ion guns 59 (Step ST52 in FIG. 31).

In Embodiment 2, argon ion beams are used for surface activation treatment. The object of the argon ion beam treatment is to eliminate extraneous matters or contaminants on the front face of the bonded surfaces and generate dangling bonds on the front face of the bonded surfaces.

After completion of the emission of the argon ion beams, the substrates are brought in contact with each other and further pressed, with the bonder chamber 58 being maintained in a high vacuum. Consequently, the substrates are bonded together (Step ST53 in FIG. 31).

The surface activation treatment and the bonding treatment are consecutively performed in a high vacuum. Thus, dangling bonds formed on the front face of one of the bonded surfaces are bonded to dangling bonds formed on the other bonded surface to be brought in contact to avoid the termination. Thus, a strong bond is formed between the surfaces.

In Embodiment 2, the space 43 formed after bonding of the bonded surfaces is in a vacuum as high as that in the bonder chamber 58. Thus, the chemical solution can immediately infiltrate the space 43 when the supporting diamond substrate 3 is removed. Specifically, the pressure in the space 43 can be reduced without placing the chemical solution for immersion itself in a reduced pressure environment. Thus, the supporting diamond substrate 3 can be removed for a short period of time.

Although the space 43 is in a high vacuum in Embodiment 2, the space 43 need not always be in a high vacuum but should be at a pressure lower than the atmospheric pressure. Even when the space 43 is approximately at 0.05 MPa, the advantages can be fully obtained.

To evacuate the space 43, implementing the bonding method involving the hydrophilic treatment according to Embodiment 1 in a reduced pressure environment is not favorable in view of the bondability. This is because most water on the front face of the bonded surfaces is released in a reduced pressure environment, and thus, a sufficient hydrogen bond cannot be obtained, though FIG. 21 illustrates that the substrates need to be fixed by the hydrogen bond via water molecules on the front face of the bonded surfaces. Thus, it is desirable to perform the bonding in the method illustrated in FIG. 32 for evacuating the space 43.

Figure 32:
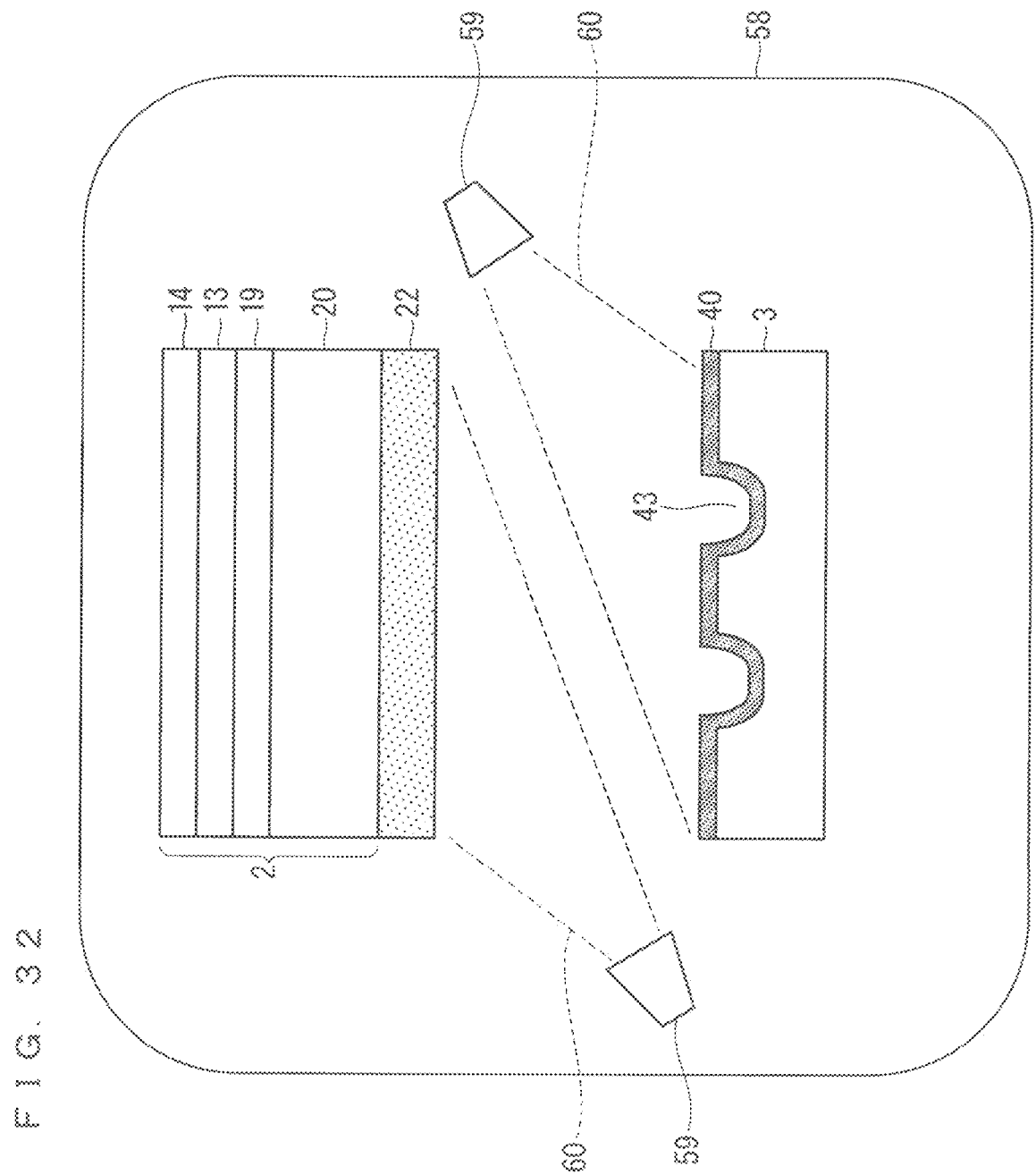
FIG. 32 is a cross-sectional view illustrating an example state during the process of fabricating a composite substrate according to the embodiment.

As illustrated in the example of FIG. 32, a risk of a disbond caused by expansion of gas contained in voids at a bonding interface (a non-bonded portion) or in the space 43 can be reduced during the bonding in a vacuum in the high-temperature process or the vacuum process in the transistor processes that are latter processes.

As such, Embodiment 2 enables fabrication of a composite substrate while shortening the time required to remove the supporting diamond substrate 3 (Step ST54 in FIG. 31).

Advantages of Embodiments

Next, example advantages of Embodiments above will be described. Although the advantages are described based on the specific structures whose examples are described in Embodiments above, the structures may be replaced with other specific structures whose examples are described in this DESCRIPTION as long as the same advantages are produced.

The replacement may be performed across a plurality of embodiments. Specifically, the replacement may be performed when combinations of the structures whose examples are described in different embodiments produce the same advantages.

According to the embodiments, a first bonding material is formed in a first surface of a first substrate in a method for manufacturing a composite substrate. Here, the first substrate corresponds to, for example, the supporting diamond substrate 3. Furthermore, the first bonding material corresponds to, for example, the $SiO_2$ bonding layer 40. At least one groove located more inward than the periphery 10 in a plan view of the supporting diamond substrate 3 is formed in the first surface. Here, the groove corresponds to, for example, the machined groove 35. Then, the $SiO_2$ bonding layer 40 is formed along an inner wall of the machined grooves 35. The $SiO_2$ bonding layer 40 does not fill in space 43 enclosed by the inner wall of the machined grooves 35. Then, a second bonding material is formed on a second surface of a second substrate. Here, the second substrate corresponds to, for example, the GAN-on-diamond substrate 2. Furthermore, the second bonding material corresponds to, for example, the $SiO_2$ bonding layer 22. The $SiO_2$ bonding layers 40 and 22 are bonded together in a region except the machined grooves 35.

In such a structure, infiltration of a dissolving solution in the space 43 enclosed by the inner wall of the machined grooves 35 accelerates dissolution of the $SiO_2$ bonding layers 40 and 22. Thus, the time required to remove the supporting diamond substrate 3 can be shortened. Formation of the machined grooves 35 more inward than the periphery 10 can prevent dissolution of the $SiO_2$ bonding layers 40 and 22 in an unintended process and flaking of the composite substrate.

When at least one of the other structures whose examples are described in the DESCRIPTION is appropriately added to the structure above, that is, when the other structures whose examples are described in the DESCRIPTION but not mentioned in the structure above are appropriately added, the same advantages can be produced.

When there is no particular limitation, the order of the processes can be changed.

According to the embodiments, the $SiO_2$ bonding layers 40 and 22 are bonded together after being activated with oxygen plasma. In such a structure, bonding the activated $SiO_2$ bonding layers 40 and 22 together can form the composite substrate 1.

According to the embodiments, the $SiO_2$ bonding layers 40 and 22 are bonded together after being activated with ion beams in a vacuum environment. Since the space 43 formed in the composite substrate 1 after the bonding is in a vacuum, the dissolving solution easily infiltrates the space 43.

According to the embodiments, the composite substrate 1 with the $SiO_2$ bonding layers 40 and 22 being bonded together is immersed in the dissolving solution. In such a structure, dissolving the $SiO_2$ bonding layers 40 and 22 with the dissolving solution can remove the supporting diamond substrate 3 from the GAN-on-diamond substrate 2.

According to the embodiments, the dissolving solution is the hydrofluoric acid aqueous solution 47. In such a structure, dissolving the $SiO_2$ bonding layers 40 and 22 with the hydrofluoric acid aqueous solution 47 can remove the supporting diamond substrate 3 from the GAN-on-diamond substrate 2.

According to the embodiments, the composite substrate 1 is immersed in the dissolving solution in a reduced pressure environment. Since the air filling in the space 43 functioning as fluid channels is easily discharged to the outside of the space 43 in such a structure, the hydrofluoric acid aqueous solution 47 easily fills in the space 43.

According to the embodiments, the machined grooves 35 are formed to extend in a first direction in the first surface. The composite substrate 1 is immersed in the dissolving solution while the composite substrate 1 is disposed so that the first direction intersects with the fluid level of the dissolving solution. Since the time required for the dissolving solution infiltrating from the periphery 10 of the supporting diamond substrate 3 to reach the center of the supporting diamond substrate 3 is shortened, the time required to remove the supporting diamond substrate 3 can be shortened.

According to the embodiments, the composite substrate includes: the supporting diamond substrate 3 with the first surface; the GAN-on-diamond substrate 2 with the second surface; the $SiO_2$ bonding layer 40 formed in the first surface; and the $SiO_2$ bonding layer 22 formed on the second surface and bonded to the $SiO_2$ bonding layer 40. At least one machined groove 35 located more inward than the periphery 10 in a plan view of the supporting diamond substrate 3 is formed in the first surface. The $SiO_2$ bonding layer 40 is formed along the inner wall of the machined grooves 35, and does not fill in the space 43 enclosed by the inner wall of the machined grooves 35. Furthermore, the $SiO_2$ bonding layers 40 and 22 are bonded together in a region except the machined grooves 35.

In such a structure, infiltration of the dissolving solution in the space 43 enclosed by the inner wall of the machined grooves 35 accelerates dissolution of the $SiO_2$ bonding layers 40 and 22. Thus, the time required to remove the supporting diamond substrate 3 can be shortened. Formation of the machined grooves 35 more inward than the periphery 10 can prevent dissolution of the $SiO_2$ bonding layers 40 and 22 in an unintended process and flaking of the composite substrate.

When at least one of the other structures whose examples are described in the DESCRIPTION is appropriately added to the structure above, that is, when the other structures whose examples are described in the DESCRIPTION but not mentioned in the structure above are appropriately added, the same advantages can be produced.

According to the embodiments, the space 43 is space extending in at least two directions along the first surface. Here, the two directions in which the space 43 extends form an angle ranging between 10° and 90°. Since the hydrofluoric acid aqueous solution 47 easily infiltrates the space 43 irrespective of the direction of the composite substrate when being immersed in the hydrofluoric acid aqueous solution 47, the time required to remove the supporting diamond substrate 3 is not prolonged.

According to the embodiments, the width of the periphery 10 is more than double an interval between the machined grooves 35. Such a structure can effectively prevent inadvertent flaking of the supporting diamond substrate 3 in processes of using a chemical solution except the process of removing the supporting diamond substrate 3.

According to the embodiments, the width of the machined groove 35 ranges between 1 μm and 1 mm. Since such a structure can effectively cause the dissolving solution to infiltrate the space 43 in the machined grooves 35, the time required to remove the supporting diamond substrate 3 can be shortened.

According to the embodiments, the number of the machined grooves 35 is two or more. Furthermore, an interval between the adjacent machined grooves 35 ranges between 0.1 μm and 100 μm. Since the interval between the machined grooves 35 is shorter than or equal to 100 μm in such a structure, change in the parallelism with the supporting diamond substrate 3 due to a warp of the GAN-on-diamond substrate 2 without any support at the bottom can be prevented. Thus, the parallelism between the supporting diamond substrate 3 and the GAN-on-diamond substrate 2 that are bonded together can be maintained.

According to the embodiments, the supporting diamond substrate 3 is a diamond substrate. Such a structure enables application of the transistor processes to the GAN-on-diamond substrate 2 without any curvatures, with the GAN-on-diamond substrate 2 being supported by the supporting diamond substrate 3.

MODIFICATIONS IN EMBODIMENTS

Although the embodiments described above may specify, for example, properties of materials, the materials, dimensions, shapes, relative arrangement relationships, and conditions for implementation of each of the constituent elements, these are in all aspects illustrative and are not limited to the ones in the Description.

Therefore, numerous modifications and equivalents that have not yet been exemplified are devised within the scope of the technology disclosed in the DESCRIPTION. Examples of the numerous modifications include a case where at least one constituent element is modified, added, or omitted, and further a case where at least one constituent element in at least one embodiment is extracted and combined with a constituent element in another embodiment.

There may be more than one constituent element described as one element in the embodiments above, unless it is contradictory.

Furthermore, the constituent elements according to the embodiments are conceptual units, and include, within the scope of the technology disclosed in the DESCRIPTION, one constituent element comprising a plurality of structures, one constituent element corresponding to a part of a structure, and a plurality of constituent elements included in one structure.

Each of the constituent elements in the embodiments above includes another structure or a structure having a shape as long as it fulfils the same functions.

Furthermore, the description is referred to for all the objectives related to the present technology, and is not regarded as prior art.

When the embodiments specify, for example, the name of a material without any particular designation, the material includes another additive, for example, an alloy unless it is contradictory.

EXPLANATION OF REFERENCE SIGNS 1, 56, 57 composite substrate, 2 GAN-on-diamond substrate, 3, 3A supporting diamond substrate, 10 periphery, 11, 49, 50 Si substrate, 12 buffer layer, 13 GaN film, 14 AlGaN film, 15 GAN-on-Si substrate, 16 supporting substrate bonding layer, 17 supporting substrate, 18 GaN-transferred substrate, 19 protective layer, 20 polycrystalline diamond film, 21 polycrystalline diamond coated substrate, 22, 40, 40A, 51 $SiO_2$ bonding layer, 23 polycrystalline diamond wafer, 24 polished surface, 25 protective SiN film, 26 resist mask, 27 opening, 28 mask portion, 29 opening width, 30 mask portion width, 31 peripheral mask portion width, 33 SiN mask opening, 34 SiN mask portion, 35 machined groove, 36 machined depth, 37 machined width, 38, 41 terrace portion, 39 terrace portion width, 42 oxygen plasma, 43, 43A space, 44 electrode, 45 supporting sapphire glass, 46 wax, 47 hydrofluoric acid aqueous solution, 52 film thickness, 53, 54 etching distance, 58 bonder chamber, 59 ion gun, 60 ion beam.

The invention claimed is:

1. A method for manufacturing a composite substrate, the method comprising:
   forming a first bonding material in a first surface of a first substrate;
   wherein in the first surface, at least one groove located more inward than a periphery in a plan view of the first substrate is formed, and
   the first bonding material is formed along an inner wall of the at least one groove, the first bonding material not filling into space enclosed by the inner wall of the at least one groove,
   forming a second bonding material on a second surface of a second substrate;
   bonding the first bonding material and the second bonding material together in a region except the at least one groove with the space enclosed by the inner wall of the at least one groove being maintained in a vacuum; and
   immersing, in a dissolving solution for dissolving the first bonding material and the second bonding material, the composite substrate with the first bonding material and the second bonding material being bonded together.

2. The method according to claim 1,
   wherein the bonding of the first bonding material and the second bonding material together is performed after the first bonding material and the second bonding material are activated with oxygen plasma.

3. The method according to claim 1,
   wherein the bonding of the first bonding material and the second bonding material together is performed after the first bonding material and the second bonding material are activated with ion beams in a vacuum environment.

4. The method according to claim 1,
   wherein the dissolving solution is a hydrofluoric acid aqueous solution.

5. The method according to claim 1,
   wherein the immersing of the composite substrate in the dissolving solution is performed in a reduced pressure environment.

6. The method according to claim 1,
   wherein the at least one groove is formed to extend in a first direction in the first surface, and
   the immersing of the composite substrate in the dissolving solution is performed while the composite substrate is disposed so that the first direction intersects with a fluid level of the dissolving solution.

7. A composite substrate for manufacturing a GaN transistor made of diamond as a base material, the composite substrate comprising:
a first substrate with a first surface;
a second substrate with a second surface;
a first bonding material formed in the first surface, the first bonding material being dissolvable; and
a second bonding material formed on the second surface and bonded to the first bonding material, the second bonding material being dissolvable,
wherein at least one groove is formed in the first surface, the at least one groove being located more inward than a periphery in a plan view of the first substrate,
the first bonding material is formed along an inner wall of the at least one groove, the first bonding material not filling into space enclosed by the inner wall of the at least one groove,
the first bonding material and the second bonding material are bonded together in a region except the at least one groove,
the space enclosed by the inner wall of the at least one groove is in a vacuum,
the first bonding material and the second bonding material are arranged so that dissolution of the first bonding material and the second bonding material separates the first substrate from the second substrate.

8. The composite substrate according to claim 7,
wherein the space is space extending in at least two directions along the first surface, and
the two directions in which the space extends form an angle ranging between 10° and 90°.

9. The composite substrate according to claim 7,
wherein the periphery has a width more than double an interval between the at least one groove.

10. The composite substrate according to claim 7,
wherein the at least one groove has a width ranging between 1 μm and 1 mm.

11. The composite substrate according to claim 7,
wherein the number of the at least one groove is two or more, and
an interval between the adjacent grooves ranges between 0.1 μm and 100 μm.

12. The composite substrate according to claim 7,
wherein the first substrate is a diamond substrate.

* * * * *